US012796138B2

(12) United States Patent
Hai et al.

(10) Patent No.: US 12,796,138 B2
(45) Date of Patent: Nov. 10, 2026

(54) FINGERPRINT RECOGNITION MODULE AND DISPLAY APPARATUS

(71) Applicant: BOE Technology Group Co., Ltd., Beijing (CN)

(72) Inventors: Xiaoquan Hai, Beijing (CN); Xiaochuan Chen, Beijing (CN); Lei Wang, Beijing (CN); Yingzi Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 368 days.

(21) Appl. No.: 18/579,362

(22) PCT Filed: Jul. 1, 2022

(86) PCT No.: PCT/CN2022/103449
§ 371 (c)(1),
(2) Date: Jan. 14, 2024

(87) PCT Pub. No.: WO2023/000964
PCT Pub. Date: Jan. 26, 2023

(65) Prior Publication Data

US 2025/0113636 A1 Apr. 3, 2025

(30) Foreign Application Priority Data

Jul. 22, 2021 (CN) ......................... 202110831284.9

(51) Int. Cl.
*G06V 40/13* (2022.01)
*H10F 39/00* (2025.01)
(Continued)

(52) U.S. Cl.
CPC ..... *H10F 39/8057* (2025.01); *G06V 40/1318* (2022.01); *H10F 39/198* (2025.01);
(Continued)

(58) Field of Classification Search
CPC .................................................. G06V 40/1318
See application file for complete search history.

(56) References Cited

U.S. PATENT DOCUMENTS

| | | | | |
|---|---|---|---|---|
| 11,501,559 | B2 * | 11/2022 | Wang | G06V 10/145 |
| 11,734,946 | B2 * | 8/2023 | Chiu | G06F 3/042 |

(Continued)

FOREIGN PATENT DOCUMENTS

| | | | |
|---|---|---|---|
| CN | 110674798 | A | 1/2020 |
| CN | 111095286 | A | 5/2020 |

(Continued)

OTHER PUBLICATIONS

English language machine translation of CN111626100A for convenience created with EPO/Google (Year: 2020).*

(Continued)

*Primary Examiner* — Christopher A Johnson
(74) *Attorney, Agent, or Firm* — IPro, PLLC

(57) ABSTRACT

The disclosure provides a fingerprint recognition module and a display apparatus, including: a base substrate; a photosensitive device layer above the base substrate and including a plurality of photosensitive devices; a bias metal layer and a noise reduction metal layer sequentially on the side of the photosensitive device layer distant from the base substrate; a light guide film layer including at least two light shielding layers arranged in a stacked manner, and a micro-lens layer on the side of the light guiding film layer facing away from the photosensitive device layer and including a plurality of microlenses. Each of the light shielding layers is provided with light transmitting holes arranged in an array, the light transmitting holes in all the light shielding layers are provided in a one-to-one correspondence manner. An
(Continued)

orthogonal projection of the microlens covers the orthogonal projections of the light transmitting holes on the base substrate.

15 Claims, 27 Drawing Sheets

(51) Int. Cl.

| | |
|---|---|
| ***H10F 39/12*** | (2025.01) |
| ***H10K 59/65*** | (2023.01) |
| ***H10K 59/80*** | (2023.01) |

(52) U.S. Cl.
CPC ......... *H10F 39/8063* (2025.01); *H10K 59/65* (2023.02); *H10K 59/8794* (2023.02)

(56) References Cited

U.S. PATENT DOCUMENTS

| | | | |
|---|---|---|---|
| 2016/0037099 A1 | 2/2016 | Mandelli et al. | |
| 2016/0037114 A1 | 2/2016 | Mandelli et al. | |
| 2019/0180017 A1 | 6/2019 | Takashima et al. | |
| 2020/0387684 A1* | 12/2020 | Setlak | G06F 3/0421 |
| 2021/0133423 A1 | 5/2021 | Zhang et al. | |
| 2022/0067326 A1 | 3/2022 | Wang et al. | |

FOREIGN PATENT DOCUMENTS

| | | |
|---|---|---|
| CN | 111626100 A | 9/2020 |
| CN | 111881873 A | 11/2020 |
| CN | 112001337 A | 11/2020 |
| CN | 112699761 A | 4/2021 |
| CN | 113128475 A | 7/2021 |
| KR | 20200145111 A | 12/2020 |
| TW | M595262 U | 5/2020 |

OTHER PUBLICATIONS

English language machine translation of CN112001337A for convenience created with EPO/Google (Year: 2020).*
Ding machine translation (Year: 2020).*
CN 202110831284.9 first office action dated Dec. 23, 2025.
PCT/CN2022/103449 international search report Sep. 23, 2022.

* cited by examiner

FINGERPRINT RECOGNITION MODULE AND DISPLAY APPARATUS

CROSS REFERENCE TO RELATED APPLICATIONS

The application is a US National Stage of International Application No. PCT/CN2022/103449, filed on Jul. 1, 2022, which claims the priority to Chinese Patent Application No. 202110831284.9, filed to the China National Intellectual Property Administration on Jul. 22, 2021 and entitled "FINGERPRINT RECOGNITION MODULE AND DISPLAY APPARATUS", which is incorporated in its entirety herein by reference.

TECHNICAL FIELD

The disclosure relates to the field of display technology, and particularly relates to a fingerprint recognition module and a display apparatus.

BACKGROUND

With the rapid development of information industry, the biological recognition technology has been increasingly used. Since fingerprints vary from user to user, user identities can be verified accordingly. Fingerprint recognition technology has been widely used in mobile terminals, smart homes and other fields, so as to ensure security of user information.

Optical Fingerprint Recognition is one of the means used to get fingerprints recognised. A principle of the optical fingerprint recognition is as follows: when a finger is placed on a display product, a light source of the display product emits light to positions of a valley and a ridge of the finger, and the light is reflected by the valley and the ridge of the finger and then is incident on a photosensitive device of the display product. Due to a difference in intensity of light reflected from the positions of the valley and the ridge, the photosensitive device generates different electrical signals according to the difference. This is how fingerprint recognition is achieved.

SUMMARY

A specific solution of a fingerprint recognition module and a display apparatus according to embodiments of the disclosure is as follows.

In an aspect, an embodiment of the disclosure provides a fingerprint recognition module. The fingerprint recognition module includes: a base substrate; a photosensitive device layer above the base substrate, where the photosensitive device layer includes a plurality of photosensitive devices; a bias metal layer located on a side of the photosensitive device layer facing away from the base substrate; a noise reduction metal layer on a side of the bias metal layer facing away from the photosensitive device layer; a light guide film layer including at least two light shielding layers arranged in a stacked manner, where each of the light shielding layers is provided with light transmitting holes arranged in an array, the light transmitting holes in all the light shielding layers are provided in a one-to-one correspondence manner, orthogonal projections of the light transmitting holes in a one-to-one correspondence manner on the base substrate are at least partially overlapped, orthogonal projections of the light transmitting holes correspondingly arranged on the base substrate are located within an orthogonal projection of a photosensitive device on the base substrate, and a light shielding layer close to the photosensitive device layer is disposed in a same layer as at least one of the bias metal layer and the noise reduction metal layer; and a microlens layer located on one side of the light guide film layer facing away from the photosensitive device layer, where the microlens layer comprises a plurality of microlenses, and an orthogonal projection of the microlens on the base substrate covers and is larger than the orthogonal projections of the light transmitting holes on the base substrate.

In some embodiments, diameters of the light transmitting holes correspondingly arranged in all the light shielding layers increase sequentially in a direction of ascending distance from the photosensitive device layer.

In some embodiments, in the fingerprint recognition module according to the embodiment of the disclosure, orthogonal projections of centers of the light transmitting holes correspondingly arranged in all the light shielding layers on the base substrate are overlapped.

In some embodiments, in the fingerprint recognition module according to the embodiment of the disclosure, the light guide film layer includes a first light shielding layer, a first light transmitting layer, a second light shielding layer, a second light transmitting layer, a third light shielding layer and a third light transmitting layer that are sequentially stacked on the photosensitive device layer. The first light shielding layer includes first light transmitting holes arranged in an array. The second light shielding layer includes second light transmitting holes arranged in an array. The third light shielding layer includes third light transmitting holes arranged in an array.

In some embodiments, in the fingerprint recognition module according to the embodiment of the disclosure, the first light shielding layer is reused as the bias metal layer.

In some embodiments, in the fingerprint recognition module according to the embodiment of the disclosure, the first light shielding layer and the noise reduction metal layer are disposed in a same layer and made of the same material.

In some embodiments, in the fingerprint recognition module according to the embodiment of the disclosure, the first light shielding layer is reused as the bias metal layer, and the second light shielding layer and the noise reduction metal layer are disposed in a same layer and made of the same material.

In some embodiments, in the fingerprint recognition module according to the embodiment of the disclosure, the light guide film layer and the microlenses satisfy the following relational expressions:

$$L = h + h_1 + h_2 + h_3 + h_{x1} + h_{x2};$$

$$L = \left[W_3^2/(8h) + h/2\right] * K;$$

$$W_0 = L * \tan\theta;$$

$$(W_1 - W_0)/(2h_1) \leq (W_2 - W_1)/[2(h_2 + h_{x1})] \leq (W_3 - W_2)/[2(h_3 + h_{x2})],$$

where L denotes a distance between a top surface of the microlens and the first light shielding layer, θ denotes a light receiving angle, K denotes a specific coefficient related to the microlens, $W_0$ denotes a diameter of the first light transmitting hole, $W_1$ denotes a diameter of the second light transmitting hole, $W_2$ denotes a diameter of the third light transmitting hole, $W_3$ denotes an aperture of the microlens, $h_1$ denotes a thickness of the first light transmitting layer, $h_2$ denotes a thickness of the second light transmitting layer, $h_3$ denotes a thickness of the third light transmitting layer, $h_{x1}$ denotes a thickness of the second light shielding layer, and $h_{x2}$ denotes a thickness of the third light shielding layer.

In some embodiments, in the fingerprint recognition module according to the embodiment of the disclosure, $1° \leq \theta \leq 10°$, 2 $\mu m \leq W_0 \leq 10$ $\mu m$, 4 $\mu m \leq W_1 \leq 15$ $\mu m$, 6 $\mu m \leq W_2 \leq 18$ $\mu m$, 10 $\mu m \leq W_3 \leq 30$ $\mu m$, 1 $\mu m \leq h_1 \leq 10$ $\mu m$, 1 $\mu m \leq h_2 \leq 5$ $\mu m$, 1 $\mu m \leq h_3 \leq 10$ $\mu m$, 1 $\mu m \leq h_{x1} \leq 2$ $\mu m$, 1 $\mu m \leq h_{x2} \leq 2$ $\mu m$.

In some embodiments, in the fingerprint recognition module according to the embodiment of the disclosure, each of the photosensitive devices includes at least one independent photosensitive sub-device, and the photosensitive sub-device includes a first electrode, a photoelectric conversion layer and a second electrode that are stacked. The photosensitive sub-device and the microlens are arranged in a one-to-one correspondence manner, and an orthogonal projection of the photoelectric conversion layer on the base substrate is located within an orthogonal projection of the microlens on the base substrate.

In some embodiments, the fingerprint recognition module according to the embodiment of the disclosure further includes a plurality of pixel driving circuits and a plurality of connection electrodes. The plurality of pixel driving circuits and the plurality of connection electrodes are located between the photosensitive device layer and the base substrate. Each of the photosensitive devices includes a plurality of photosensitive sub-devices that are independent from each other, and the first electrode is disposed in a same layer as the connection electrode. The first electrodes of all the photosensitive sub-devices are electrically connected with the pixel driving circuits via the connection electrodes, and the second electrodes of all the photosensitive sub-devices are each electrically connected with the bias metal layer.

In some embodiments, in the fingerprint recognition module according to the embodiment of the disclosure, the bias metal layer includes a plurality of bias lines. Each of the bias lines includes a main body part extending in a column direction and a plurality of protruding parts on the same side of the main body part. The protruding parts are electrically connected with the second electrodes in one of the photosensitive devices respectively.

In some embodiments, in the fingerprint recognition module according to the embodiment of the disclosure, the pixel driving circuit includes: a reset transistor, an amplifying transistor, and a read transistor. The reset transistor and the read transistor are double-gate transistors.

In some embodiments, in the fingerprint recognition module according to the embodiment of the disclosure, a distance between a surface of a side of the base substrate facing the photosensitive device layer and an apex of the microlens is greater than or equal to 30 μm and less than or equal to 50 μm.

In another aspect, an embodiment of the disclosure provides a display apparatus. The display apparatus includes the fingerprint recognition module according to the embodiment of the disclosure and a display module located above the fingerprint recognition module. The display module is fixed to the fingerprint recognition module via optically clear adhesive.

In some embodiments, in the display apparatus according to the embodiment of the disclosure, an orthogonal projection of the fingerprint recognition module on a plane where the display apparatus is located and an orthogonal projection of the display module on the plane where the display apparatus is located are approximately overlapped. The optically clear adhesive is located in a frame zone of the display module.

In some embodiments, in the display apparatus according to the embodiment of the disclosure, the display module includes an organic electroluminescent display panel, a heat dissipation film on a side of a display surface facing away from the organic electroluminescent display panel, and a middle frame on a side of the heat dissipation film facing away from the organic electroluminescent display panel. The heat dissipation film includes a hollow structure. The fingerprint recognition module is arranged in the hollow structure, and the fingerprint recognition module is fixed to the middle frame via the optically clear adhesive.

DETAILED DESCRIPTION

Figure 1:
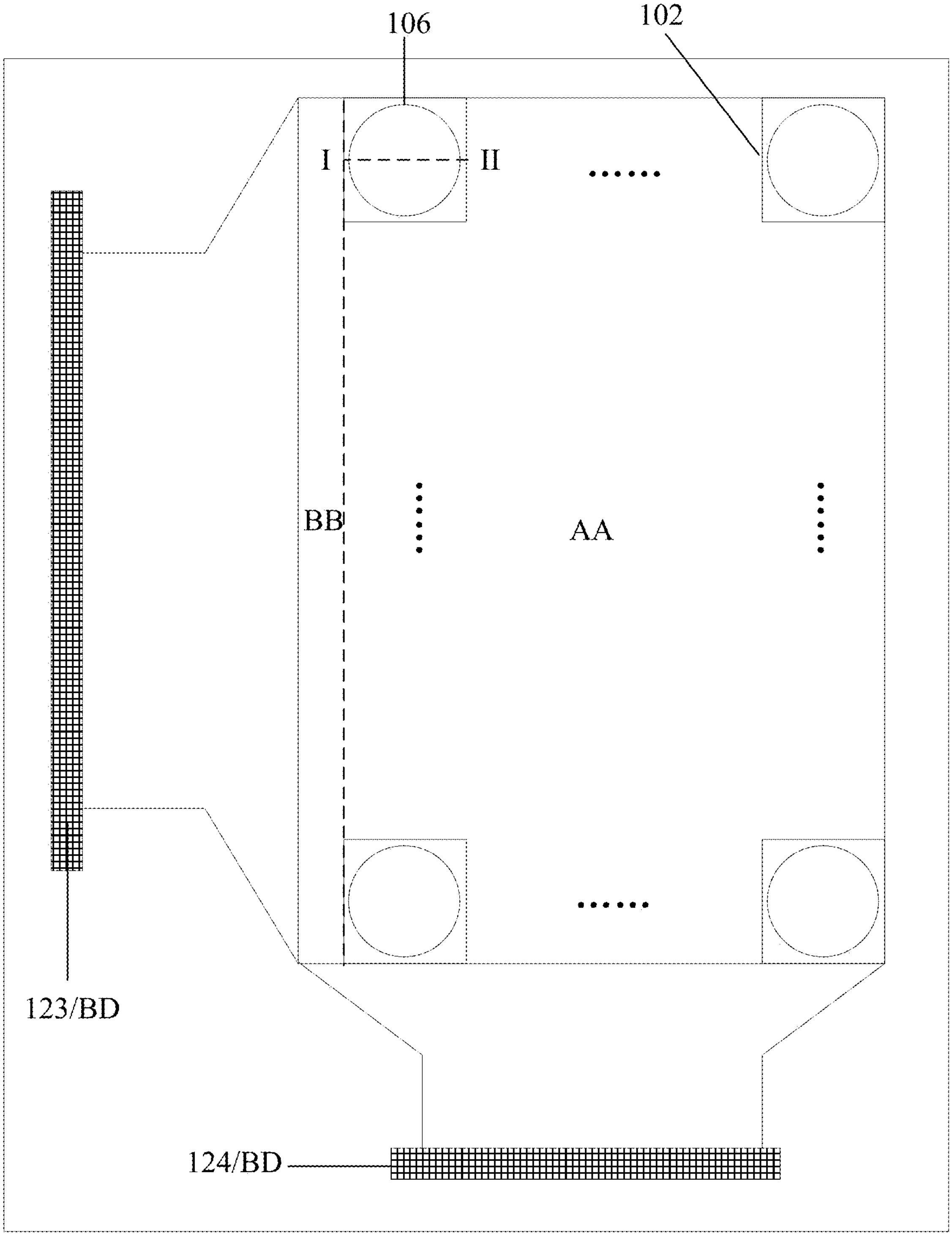
FIG. 1 is a schematic structural diagram of a fingerprint recognition module according to an embodiment of the disclosure.

For making objectives, technical solutions and advantages of embodiments of the disclosure clearer, the technical solutions of the embodiments of the disclosure will be clearly and completely described below in conjunction with the accompanying drawings in the embodiments of the disclosure. It should be noted that a size and a shape of each figure in the drawings do not reflect a true scale, but only for illustrating the disclosure. Throughout the drawings, identical or similar reference numerals denote identical or similar elements or elements having identical or similar functions.

Unless otherwise defined, technical or scientific terms used herein should have ordinary meanings as understood by those of ordinary skill in the art to which the disclosure belongs. “First”, “second” and similar words used in the description and claims of the disclosure do not indicate any order, amount or importance, but only for distinguishing different components. “Include”, “comprise”, and other similar words indicate that elements or objects before the word include elements or objects after the word and their equivalents, without excluding other elements or objects. “Inside”, “outside”, “upper”, “lower”, etc. are only used to indicate a relative positional relation. After an absolute position of the described object changes, the relative positional relation may also change accordingly.

In the related art, a display apparatus for in-screen fingerprint recognition includes a collimating film and a fingerprint recognition module, and the collimating film is bonded to the fingerprint recognition module via optically clear adhesive (OCA). The collimating film includes a single-layer diaphragm having a light transmitting hole and a microlens located at a side of the single-layer diaphragm facing away from the fingerprint recognition module. However, due to limitation of a collimating film technology and a single-layer diaphragm structure, crosstalk of a light path exists in a range of 40°-50°, such that fingerprint image quality under outdoor strong light is reduced, and user experience is influenced. In addition, due to a lens imprinting process, spatial noise such as diagonal exists. Further, a lens is not aligned with a photosensitive device in a fingerprint recognition substrate, such that a moire pattern exists on the lens and the light path, and a diagonal moire pattern is a high challenge to an image iterative signal processing (ISP) algorithm. In addition, at present, the single-layer diaphragm of the collimating film is made of organic resin. The single-layer diaphragm is internally provided with air medium after bonding using the optically clear adhesive. When the collimating film is subjected to testing of temperature reliability, such as double 85 degrees, cold and hot shock, mechanical characteristics of the single-layer diaphragm change due to material heating. In this way, the entire light path and appearance of the collimating film change, resulting in reliability problems.

Figure 2:
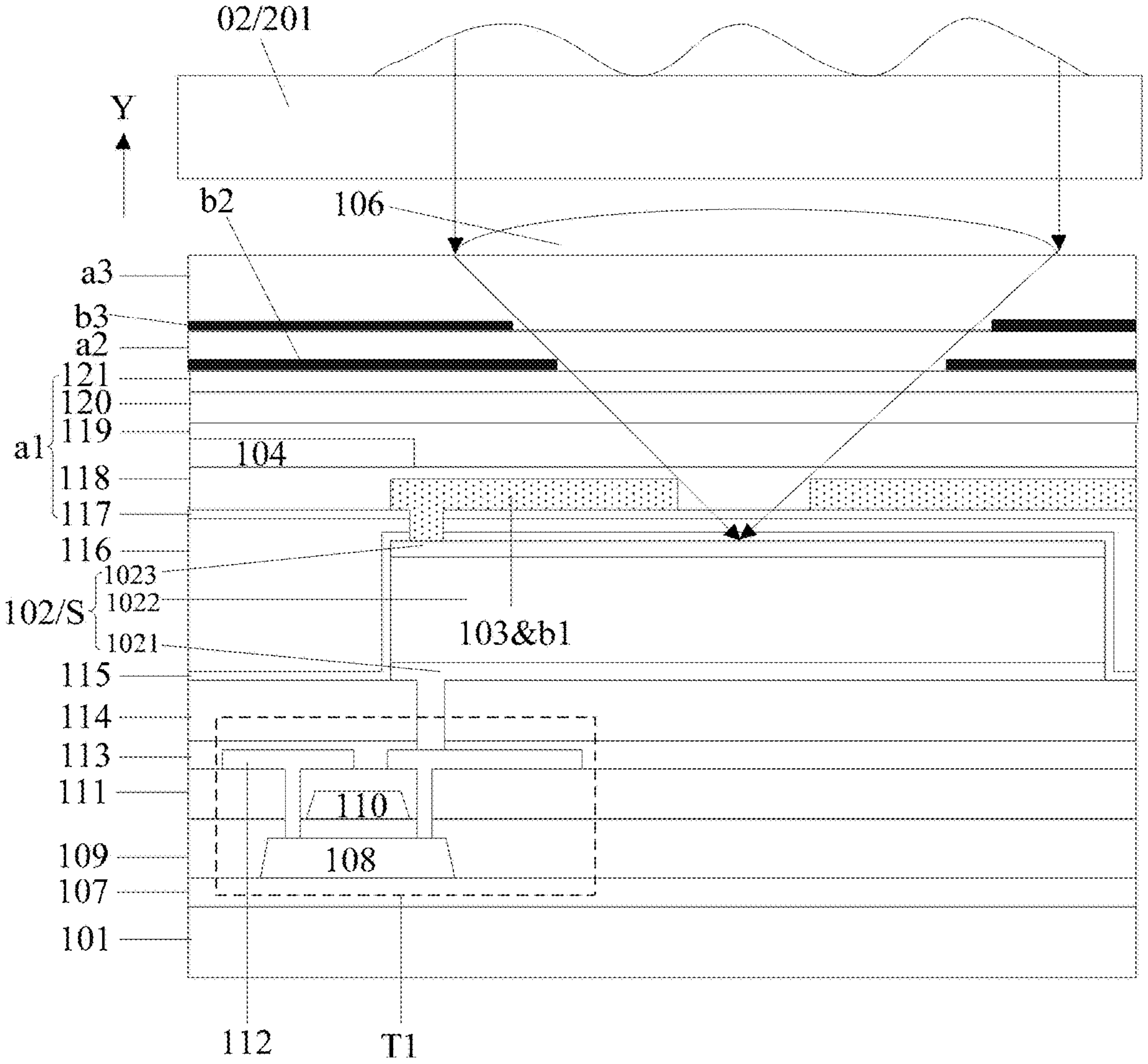
FIG. 2 is a schematic structural diagram of a cross-sectional view along line I-II of a display apparatus including the fingerprint recognition module shown in FIG. 1.

To solve the technical problems existing in the related art, an embodiment of the disclosure provides a fingerprint recognition module. As shown in FIGS. 1 and 2, the fingerprint recognition module include:

- a base substrate 101;
- a photosensitive device layer above the base substrate 101, where the photosensitive device layer includes a plurality of photosensitive devices 102;
- a bias metal layer 103 on a side of the photosensitive device layer facing away from the base substrate 101;
- a noise reduction metal layer 104 on a side of the bias metal layer 103 facing away from the photosensitive device layer;
- a light guide film layer 105 including at least two light shielding layers a arranged in stack, where each of the light shielding layers is provided with light transmitting holes H arranged in an array, the light transmitting holes H in all the light shielding layers a are provided in a one-to-one correspondence manner, orthogonal projections of the light transmitting holes in the one-to-one correspondence manner on the base substrate 101 are at least partially overlapped, the orthogonal projections of the light transmitting holes H correspondingly arranged on the base substrate 101 are located within an orthogonal projection of the photosensitive device 102 on the base substrate 101, and the light shielding layer a close to the photosensitive device layer is disposed in a same layer as at least one of the bias metal layer 103 and the noise reduction metal layer 104; and a shape of the light transmitting holes H may be round or square, etc., which is not limited herein; and
- a microlens layer on a side of the light guide film layer 105 facing away from the photosensitive device layer, where the microlens layer includes a plurality of microlenses 106, and an orthogonal projections of a microlens 106 on the base substrate 101 covers and is larger than the orthogonal projections of the light transmitting holes H on the base substrate.

In the fingerprint recognition module according to the embodiment of the disclosure, the light shielding layer a close to the photosensitive device layer is arranged in the same layer as at least one of the bias metal layer 103 and the noise reduction metal layer 104, and the light guide film layer 105 including a plurality of light shielding layers a and the microlens 106 are directly integrated on the photosensitive device 102. In this way, problems of large-angle crosstalk, film diagonal/moire pattern and poor reliability in a solution of bonding the collimating film in the related art can be effectively solved, and further accuracy of the recognized fingerprint information in an optical fingerprint recognition process can be improved.

In addition, the light guide film layer 105 and the microlens 106 are directly integrated in the disclosure, such that the optically clear adhesive in the related art is saved. A thickness of the optically clear adhesive is generally greater than 25 μm. Therefore, a thickness of the fingerprint recognition module of the disclosure can be greatly reduced. Specifically, a distance between a surface of a side of the base substrate 101 facing the photosensitive device layer (a top surface of the base substrate 101) and an apex of the microlens 106 is greater than or equal to 30 μm and less than or equal to 50 μm.

In some embodiments, in order to weaken light crosstalk between adjacent light transmitting holes H and obtain a better collimation effect, diameters of the light transmitting holes H correspondingly arranged in all the light shielding layers a may increase sequentially in a direction Y of ascending distance from the photosensitive device layer, as shown in FIGS. 1 and 2 in the fingerprint recognition module according to the embodiment of the disclosure. A collimating hole structure is formed by parts of the light transmitting holes H at the same position of all the light shielding layers in a zone where orthogonal projections of the light transmitting holes H on the base substrate 101 are completely overlapped, which is used to collimate light rays incident to the position at various angles. In this way, the light ray that forms a certain angle (for example, less than or equal to) 10° with a normal perpendicular to a surface of the light guide film layer 105 is capable of passing the collimating hole structure, and the light rays forming an included angle exceeding the angle (for example, greater than) 10° are blocked. A difference between a minimum angle and a maximum angle of the light ray capable of passing the collimating hole structure refers to as a light receiving angle.

In some embodiments, in the fingerprint recognition module according to the embodiment of the disclosure, as shown in FIGS. 1 and 2, orthogonal projections of centers of the light transmitting holes H correspondingly arranged in all the light shielding layers a on the base substrate 101 are overlapped. It is ensured that the collimating hole structure having a better collimation effect may be formed between the light transmitting holes H at the same positions of all the light shielding layers a. During manufacturing, the orthogonal projections of the centers of the light transmitting holes H at the same positions of all the light shielding layers a on the base substrate 101 are completely overlapped as much as possible. However, according to alignment errors of an actual manufacturing process, the centers of the light transmitting holes H at the same positions of all the light shielding layers a may deviate to some extent, and complete overlapping cannot be ensured. That is, partial overlapping possibly occurs.

Figure 3:
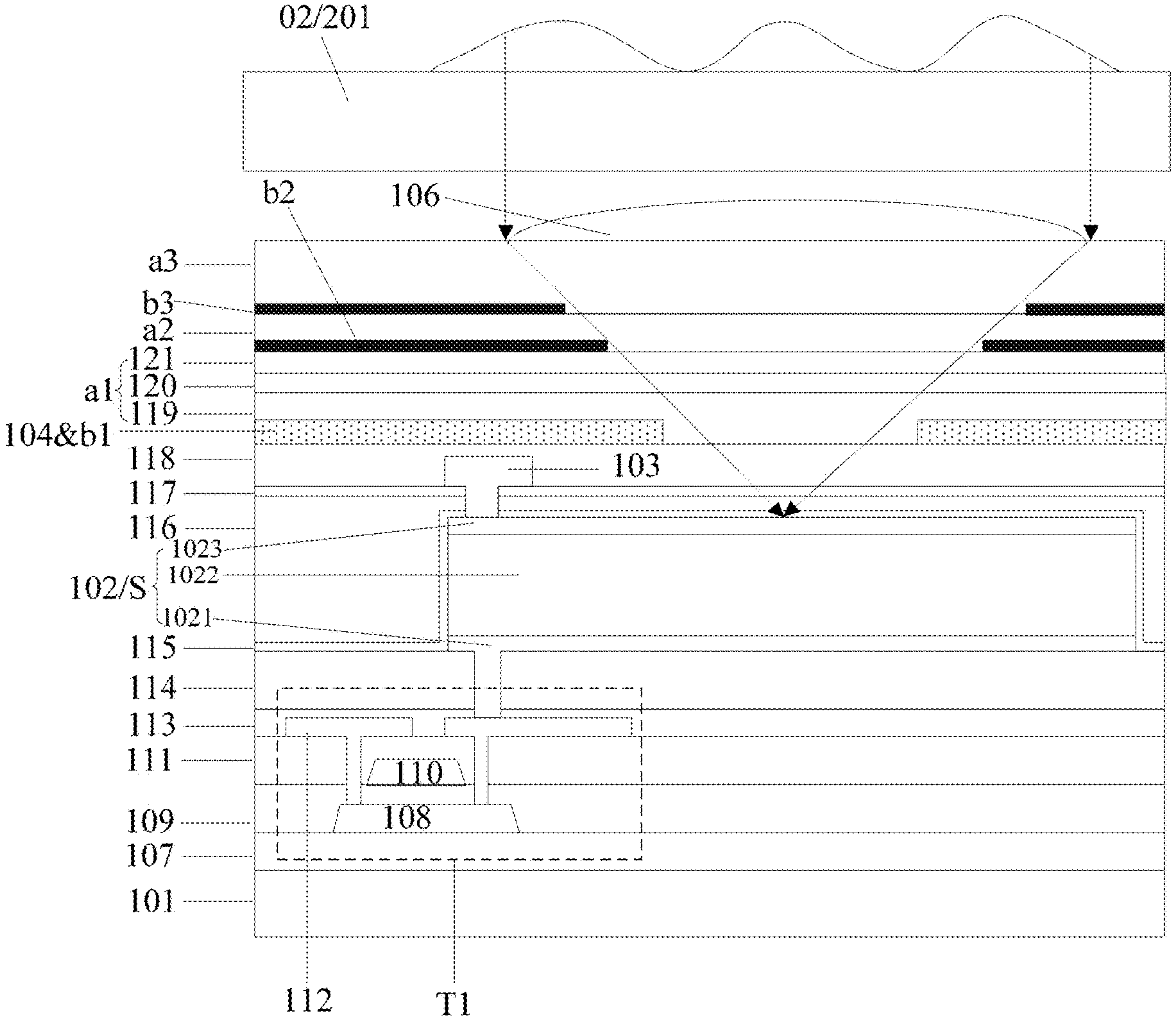
FIG. 3 is a schematic structural diagram of another cross-sectional view along line I-II of a display apparatus including the fingerprint recognition module shown in FIG. 1.
Figure 4:
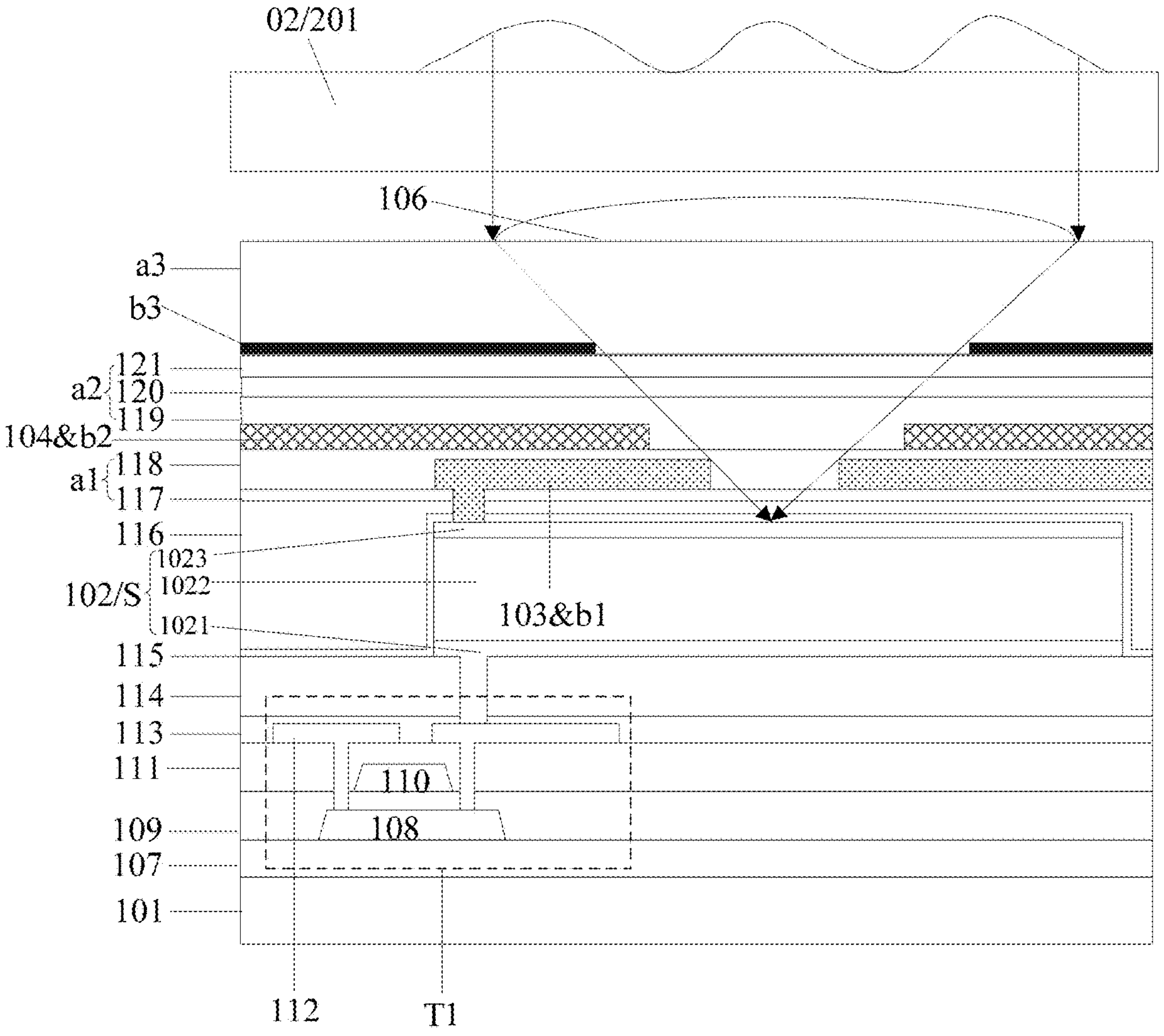
FIG. 4 is a schematic structural diagram of yet another cross-sectional view along line I-II of a display apparatus including the fingerprint recognition module shown in FIG. 1.

In some embodiments, in the fingerprint recognition module according to the embodiment of the disclosure, as shown in FIGS. 2-4, the light guide film layer 105 may include a first light shielding layer b1, a first light transmitting layer a1, a second light shielding layer b2, a second light transmitting layer a2, a third light shielding layer b3 and a third light transmitting layer a3 that are sequentially stacked on the photosensitive device layer. The first light shielding layer b1 may function as a field diaphragm, and the first light shielding layer b1 includes first light transmitting holes H1 arranged in an array. The second light shielding layer b2 and the third light shielding layer b3 are capable of preventing light crosstalk, the second light shielding layer b2 includes second light transmitting holes H2 arranged in an array, and the third light shielding layer b3 includes third light transmitting holes H3 arranged in an array. In some embodiments, a diameter of the first light transmitting hole H1, a diameter of the second light transmitting hole H2 and a diameter of the third light transmitting hole H3 gradually increase, and the orthogonal projections of the center of the first light transmitting hole H1, the center of the second light transmitting hole H2 and the center of the third light transmitting hole H3 on the base substrate 101 are approximately overlapped.

In some embodiments, as shown in FIG. 1, the fingerprint recognition module includes a display zone AA and a light shielding zone BB. In the related art, a pattern of the noise reduction metal layer 104 is generally located in the light shielding zone BB, a pattern of the bias metal layer 103 is generally located in the display zone AA. The light transmitting holes H of the disclosure is located in the display zone AA. Therefore, in the fingerprint recognition module according to the embodiment of the disclosure, in order to reduce the number of film layers, the first light shielding layer b1 may be reused as the bias metal layer 103 as shown in FIG. 2; in some embodiments, the first light shielding layer b1 and the noise reduction metal layer 104 are arranged in the same layer and made of the same material as shown in FIG. 3; in some embodiments, the first light shielding layer b1 is reused as the bias metal layer 103, and the second light shielding layer b2 and the noise reduction metal layer 104 are arranged in the same layer and made of the same material as shown in FIG. 4, which is not limited herein.

Figure 5:
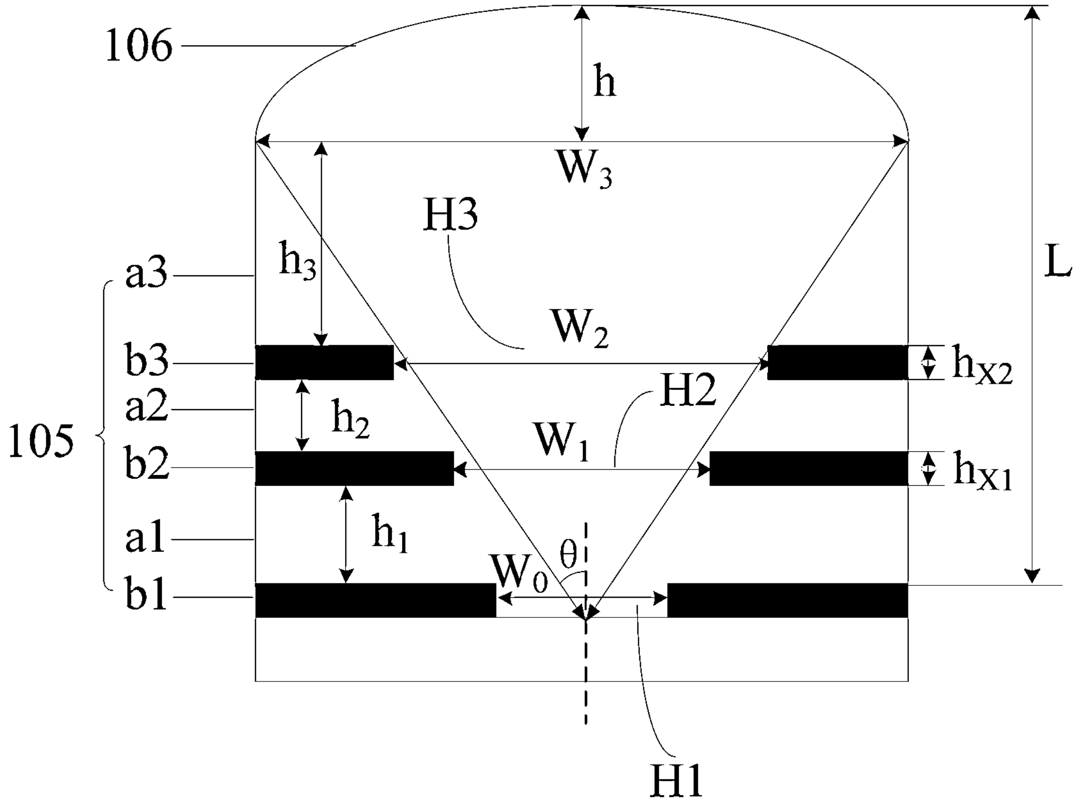
FIG. 5 is a diagram of a collimated light path according to an embodiment of the disclosure.

In some embodiments, the microlens 106 may be manufactured on the third light transmitting layer a3 with a step size of 2.5 μm using a hot reflux process. According to current process capability, a height h of the microlens 106 ranges from 1 μm to 10 μm, and an aperture $W_3$ of the microlens ranges from 10 μm to 30 μm, as shown in FIG. 5. A diameter $W_0$ of the first light transmitting holes H1 ranges from 2 μm to 10 μm, a diameter $W_1$ of the second light transmitting holes H2 ranges from 4 μm to 15 μm, and a diameter $W_2$ of the third light transmitting holes H3 ranges from 6 μm to 18 μm. A thickness $h_1$ of the first light transmitting layer a1 ranges from 1 μm to 10 μm, a thickness $h_2$ of the second light transmitting layer a2 ranges from 1 μm to 5 μm, a thickness $h_3$ of the third light transmitting layer a3 ranges from 1 μm to 10 μm, a thickness $h_{x1}$ of the second light shielding layer b2 ranges from 1 μm to 2 μm, and a thickness $h_{x2}$ of the third light shielding layer b3 ranges from 1 μm to 2 μm.

In addition, as shown in FIG. 5, in order to achieve a collimation function, interference of stray light has to be avoided, that is, a relation between the above parameters needs to be rationally controlled as follows:

a distance L between a top surface of the microlens 106 and the first light shielding layer b1 satisfies the following formulas:

$$L=h+h_1+h_2+h_3+h_{x1}+h_{x2};\text{ and} \quad (1)$$

$$L=\left[W_3^2/(8h)+h/2\right]*K, \quad (2)$$

where K denotes a specific coefficient related to the microlens 106;

the diameter $W_0$ of the first light transmitting holes H1 satisfies the following condition:

$$W_0=L*\tan\theta;$$

where θ denotes the light receiving angle, and θ ranges from 1° to 10°:

the light guide film layer 105 and the microlens 106 satisfy the following relational expression:

$$(W_1-W_0)/(2h_1)\le(W_2-W_1)/[2(h_2+h_{x1})]\le(W_3-W_2)/[2(h_3+h_{x2})]. \quad (3)$$

According to the disclosure, the light guide film layer 105 and microlens 106 are designed according to manufacturing capability of a production line. Design parameters are as follows: the aperture $W_3$ of the microlens 106 is 16 μm, an arch height h of the microlens 106 is 4 μm, the diameter $W_0$ of the first light transmitting holes H1 in the first light shielding layer b1 is 2.5 μm, the diameter $W_1$ of the second light transmitting holes H2 in the second light shielding layer b2 is 6.6 μm, and the diameter $W_2$ of the third light transmitting holes H3 in the third light shielding layer b3 is 10.7 μm; and the thickness $h_1$ of the first light transmitting layer a1 is 6.44 μm, the thickness $h_2$ of the second light transmitting layer a2 is 3.7 μm, the thickness $h_3$ of the third light transmitting layer a3 is 6 μm, the thickness $h_{x1}$ of the second light shielding layer b2 is 1 μm, and the thickness $h_{x2}$ of the third light shielding layer b3 is 1 μm.

Figure 6:
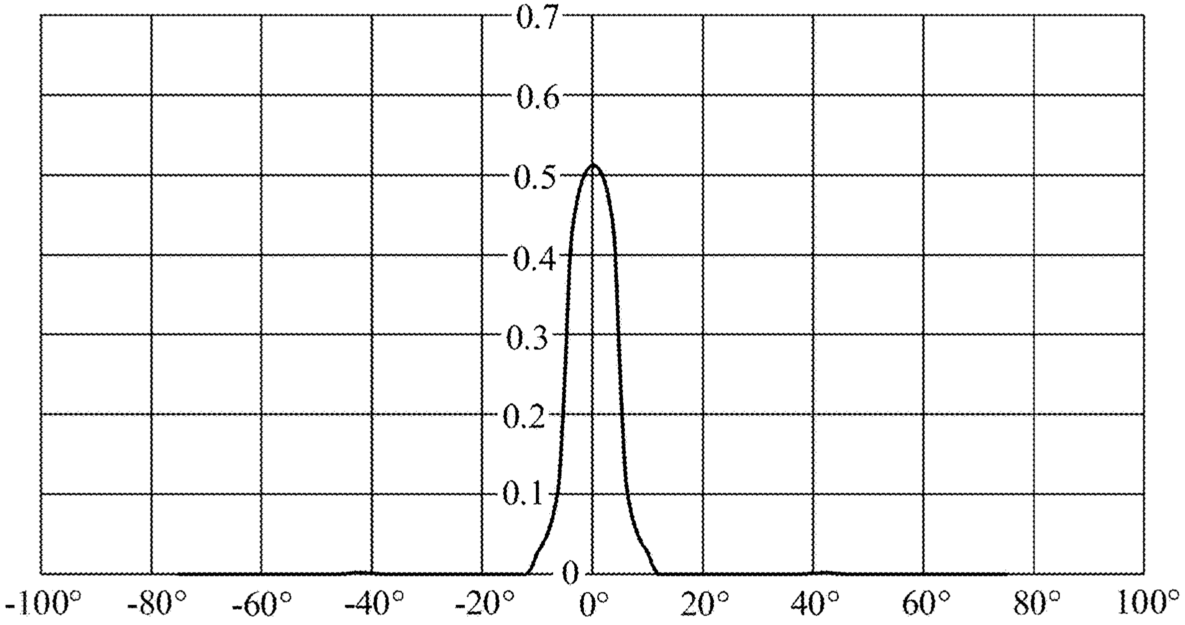
FIG. 6 is a curve graph between a light receiving angle and a transmittance of the collimated light path shown in FIG. 5.
Figure 7:
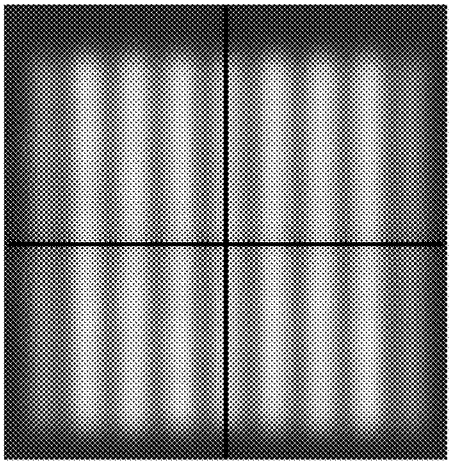
FIG. 7 shows the effect of fingerprint recognition via the collimated light path shown in FIG. 5.

An optical test is conducted on the light guide film layer 105 and the microlenses 106 with the above design parameters, and the results are shown in FIGS. 6 and 7. As may be seen from FIG. 6, the light guide film layer 105 and the microlens 106 with the above design parameters may allow light rays at 0°-10° to pass, each beam of light rays filtered may accurately correspond to a valley and a ridge of a fingerprint in a one-to-one correspondence manner, cross-talk from other stray light does not occur, and accurate fingerprint recognition may be achieved.

In some embodiments, in the fingerprint recognition module according to the embodiment of the disclosure, as shown in FIGS. 1-4 and 8-11, each of the photosensitive devices 102 includes at least one independent photosensitive sub-device S, and the photosensitive sub-device S includes a first electrode 1021, a photoelectric conversion layer 1022 and a second electrode 1023 that are stacked. The photosensitive sub-devices S and the microlenses 106 are arranged in a one-to-one correspondence manner, and orthogonal projections of the photoelectric conversion layers 1022 on the base substrate 101 are located within orthogonal projections of the microlenses 106 correspondingly arranged on the base substrate 101, such that all the light reflected by fingerprints and condensed by the microlens 106 is absorbed by the corresponding photoelectric conversion layer 1022, and further a signal amount and a signal-to-noise ratio are both increased.

Figure 8:
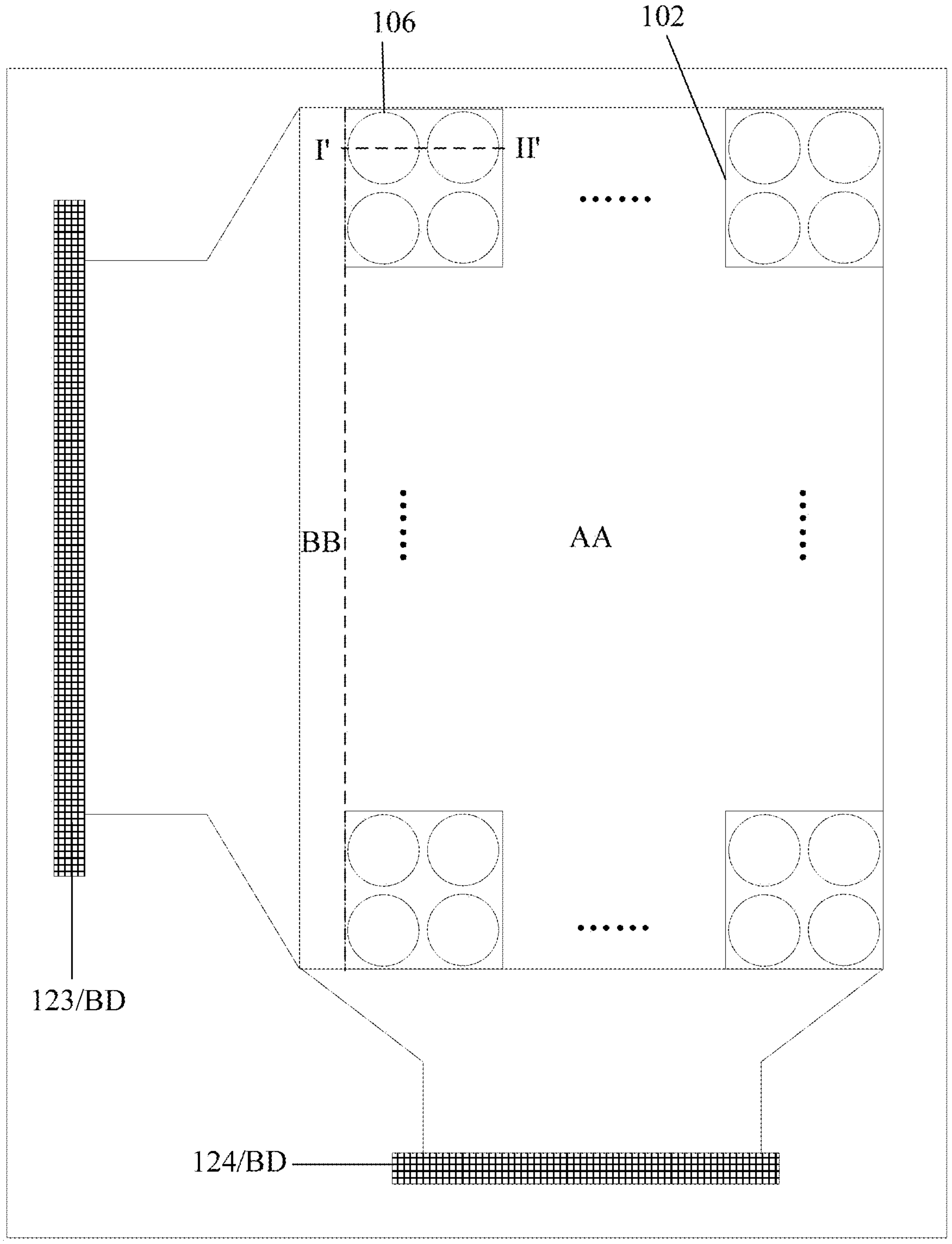
FIG. 8 is a schematic structural diagram of a fingerprint recognition module according to an embodiment of the disclosure.
Figure 12:
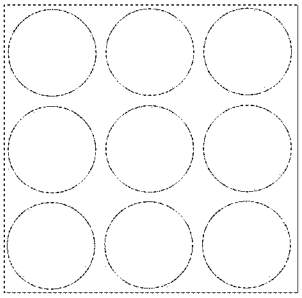
FIG. 12 is a schematic structural diagram illustrating that one photosensitive device corresponds to nine microlenses according to an embodiment of the disclosure.
Figure 13:
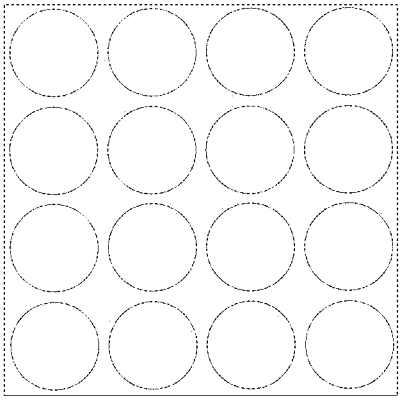
FIG. 13 is a schematic structural diagram illustrating that one photosensitive device corresponds to sixteen microlenses according to an embodiment of the disclosure.

Specifically, FIG. 1 shows that each photosensitive device 102 includes one photosensitive sub-device S, and FIG. 8 shows that each photosensitive device 102 includes four photosensitive sub-devices S. In some embodiments, each photosensitive device 102 may further include nine photosensitive sub-devices S as shown in FIG. 12; and in some embodiments, each photosensitive device 102 may further include sixteen photosensitive sub-devices S as shown in FIG. 13. Certainly, there may be other numbers of the photosensitive sub-devices S included in each photosensitive device 102, which is not limited herein. Accordingly, in FIGS. 1, 8, 12 and 13, each photosensitive device 102 corresponds to one, four, nine and sixteen microlenses 106, separately. In some embodiments, a constant lens space exists in a manufacturing process of the microlens 106, that is, a distance between centers of two adjacent microlenses 106 is fixed.

Figure 14:
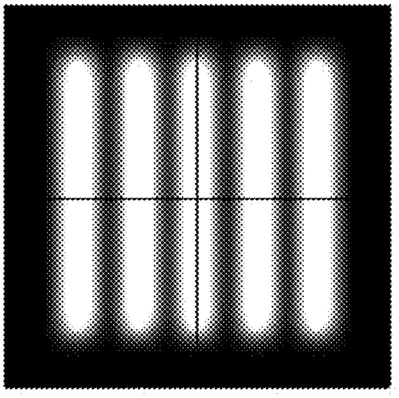
FIG. 14 shows the effect of fingerprint recognition using the fingerprint recognition module shown in FIG. 1.
Figure 15:
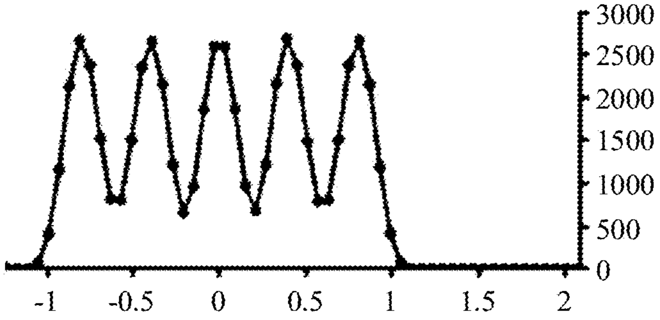
FIG. 15 is a curve graph showing a fingerprint signal amount using the fingerprint recognition module shown in FIG. 1.
Figure 16:
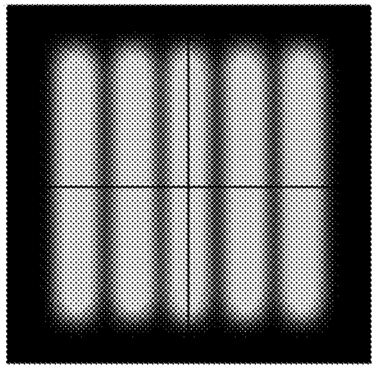
FIG. 16 shows the effect of fingerprint recognition using the fingerprint recognition module shown in FIG. 8.
Figure 17:
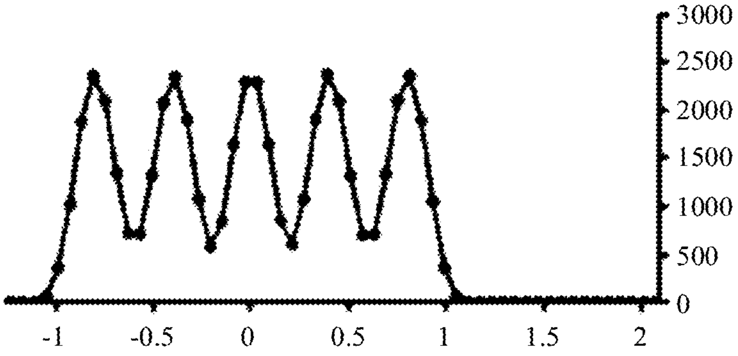
FIG. 17 is a curve graph showing a fingerprint signal amount using the fingerprint recognition module shown in FIG. 8.
Figure 18:
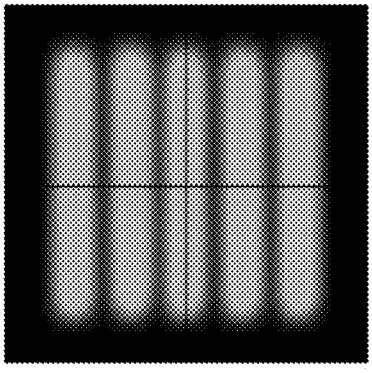
FIG. 18 shows the effect of fingerprint recognition using the fingerprint recognition module shown in FIG. 12.
Figure 19:
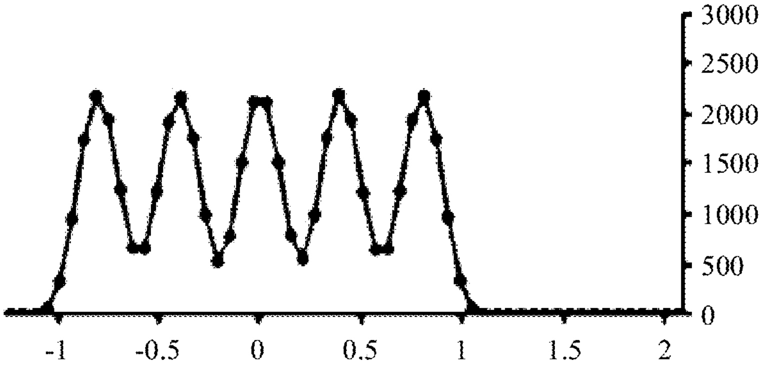
FIG. 19 is a curve graph showing a fingerprint signal amount using the fingerprint recognition module shown in FIG. 12.
Figure 20:
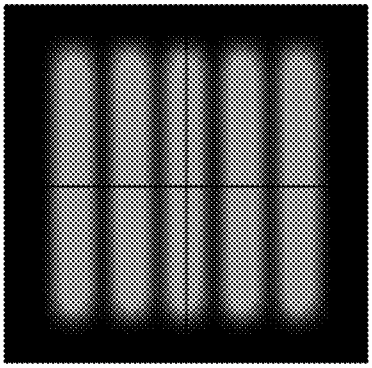
FIG. 20 shows the effect of fingerprint recognition using the fingerprint recognition module shown in FIG. 13.
Figure 21:
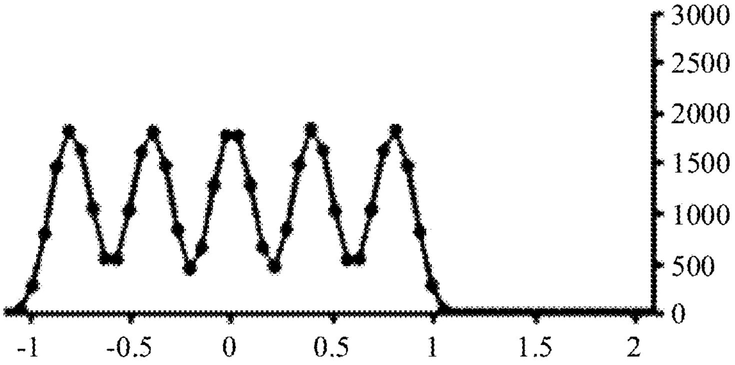
FIG. 21 is a curve graph showing a fingerprint signal amount using the fingerprint recognition module shown in FIG. 13.
Figure 22:
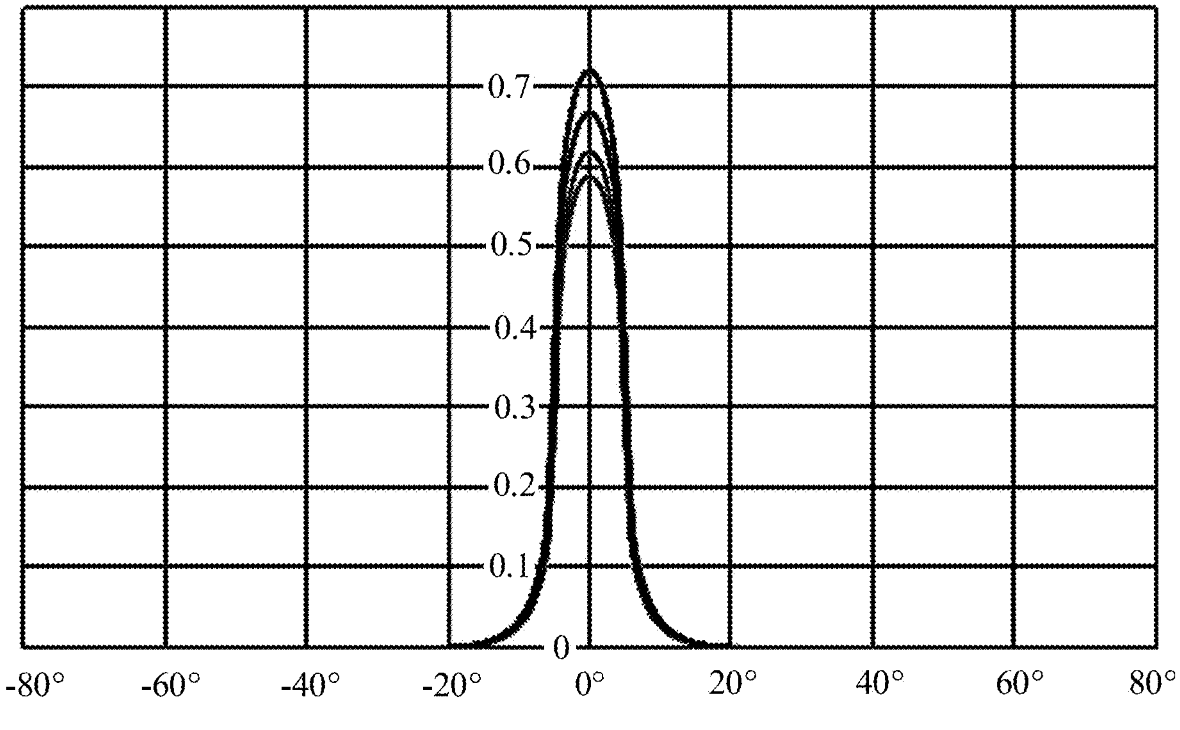
FIG. 22 is a normalized curve graph of fingerprint signal amounts using the fingerprint recognition modules shown in FIGS. 15, 17, 19 and 21.

FIGS. 14 and 15 show optical test results when one photosensitive device 102 corresponds to one microlens 106 as shown in FIG. 1. FIGS. 16 and 17 show optical test results when one photosensitive device 102 corresponds to four microlenses 106 as shown in FIG. 8. FIGS. 18 and 19 show optical test results when one photosensitive device 102 corresponds to nine microlenses 106 as shown in FIG. 12. FIGS. 20 and 21 show optical test results when one photosensitive device 102 corresponds to sixteen microlenses 106 as shown in FIG. 13. Curves from top to bottom in FIG. 22 sequentially represent relations between light receiving angles and transmittances of collimating hole structures in display substrates shown in FIGS. 1, 8, 12 and 13. As may be seen from FIGS. 14-22, under the condition of the same light receiving angle) (0°-10°), central transmittances of the collimating hole structures in the display substrates shown in FIGS. 1, 8, 12 and 13 decrease sequentially, and areas surrounded by the whole curves and abscissae decrease sequentially. The larger the area, the greater a signal intensity of a fingerprint.

Figure 9:
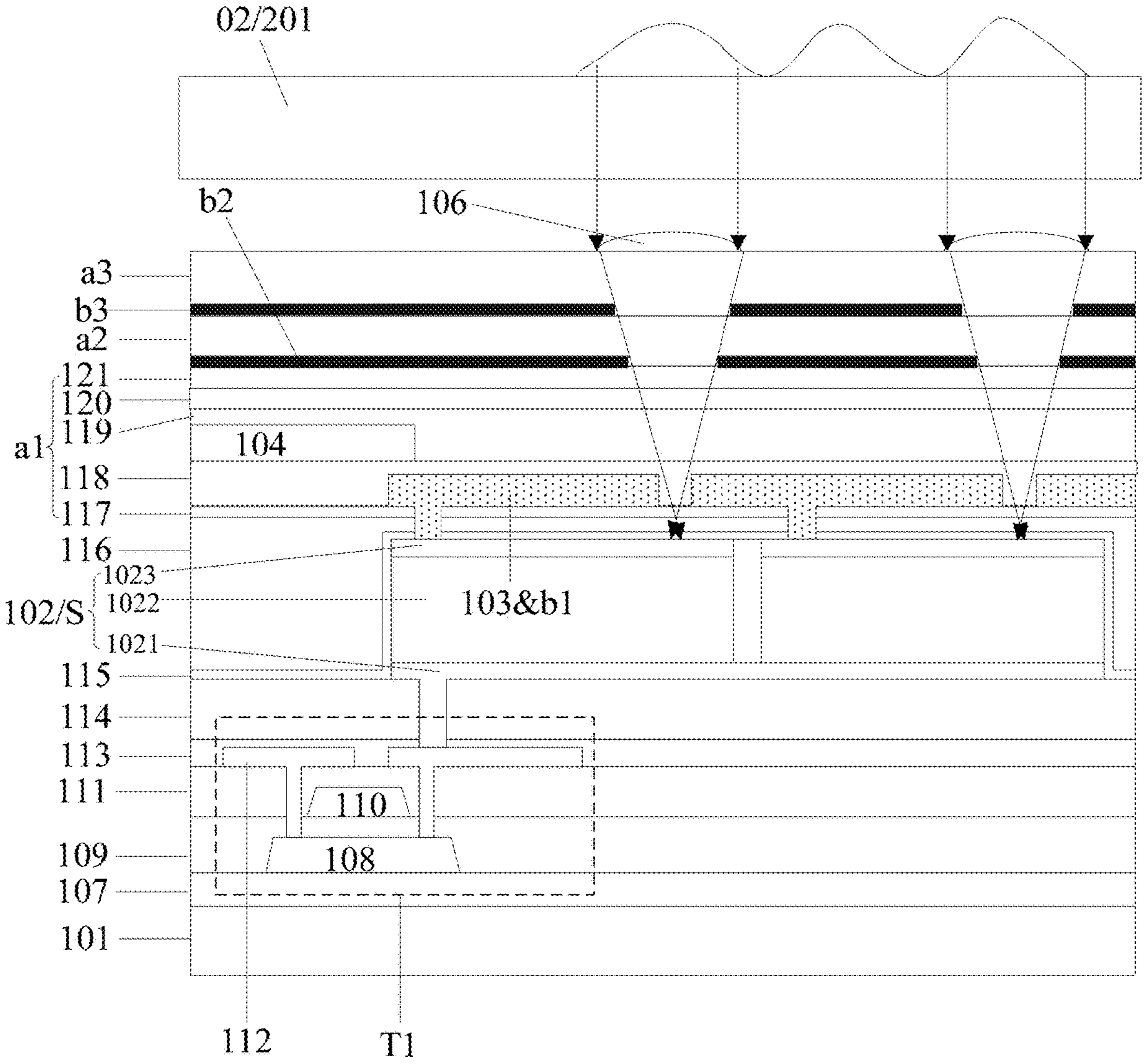
FIG. 9 is a schematic structural diagram of a cross-sectional view along line I'-II' of a display apparatus including the fingerprint recognition module shown in FIG. 8.
Figure 10:
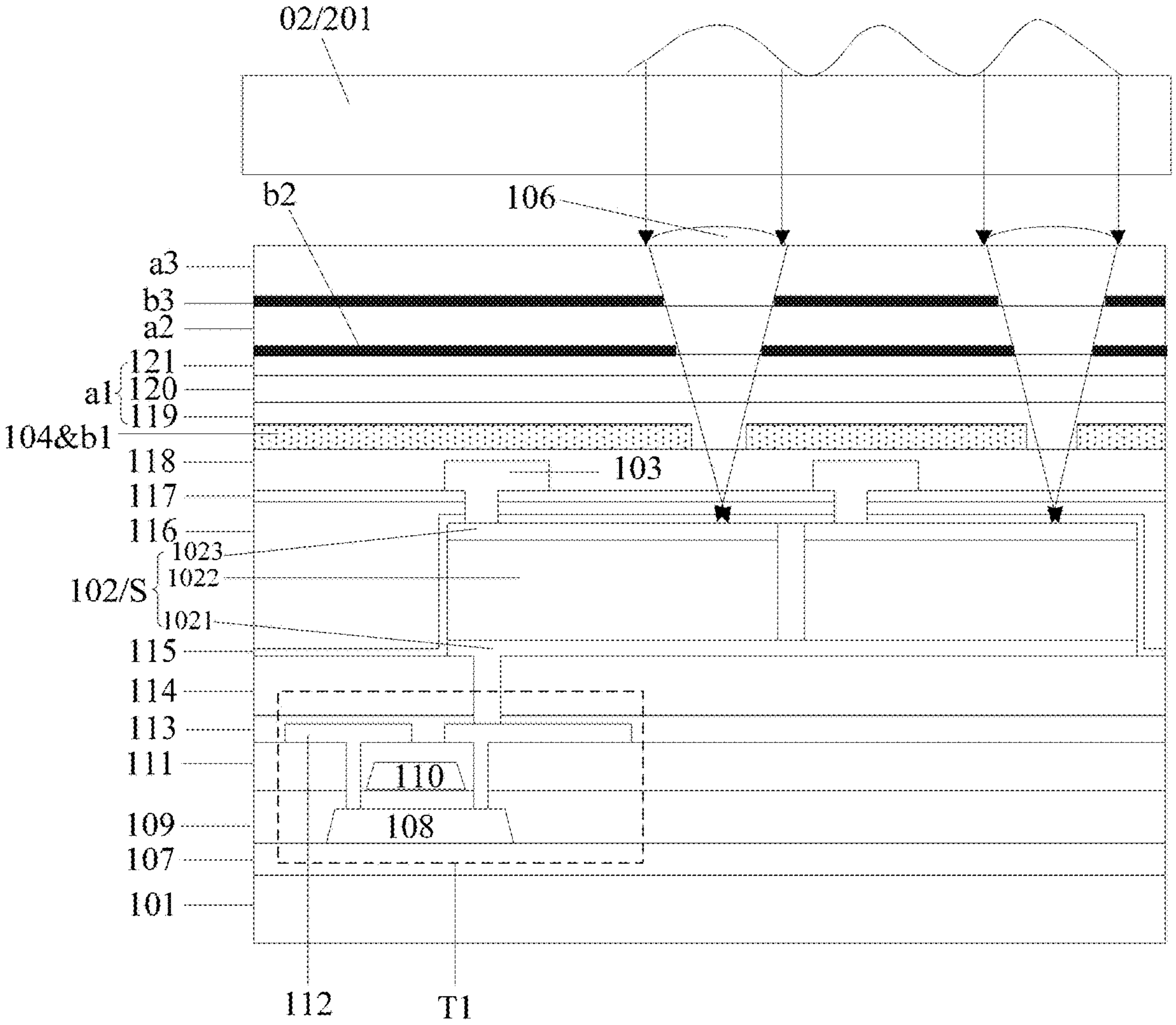
FIG. 10 is a schematic structural diagram of another cross-sectional view along line I'-II' of a display apparatus including the fingerprint recognition module shown in FIG. 8.
Figure 11:
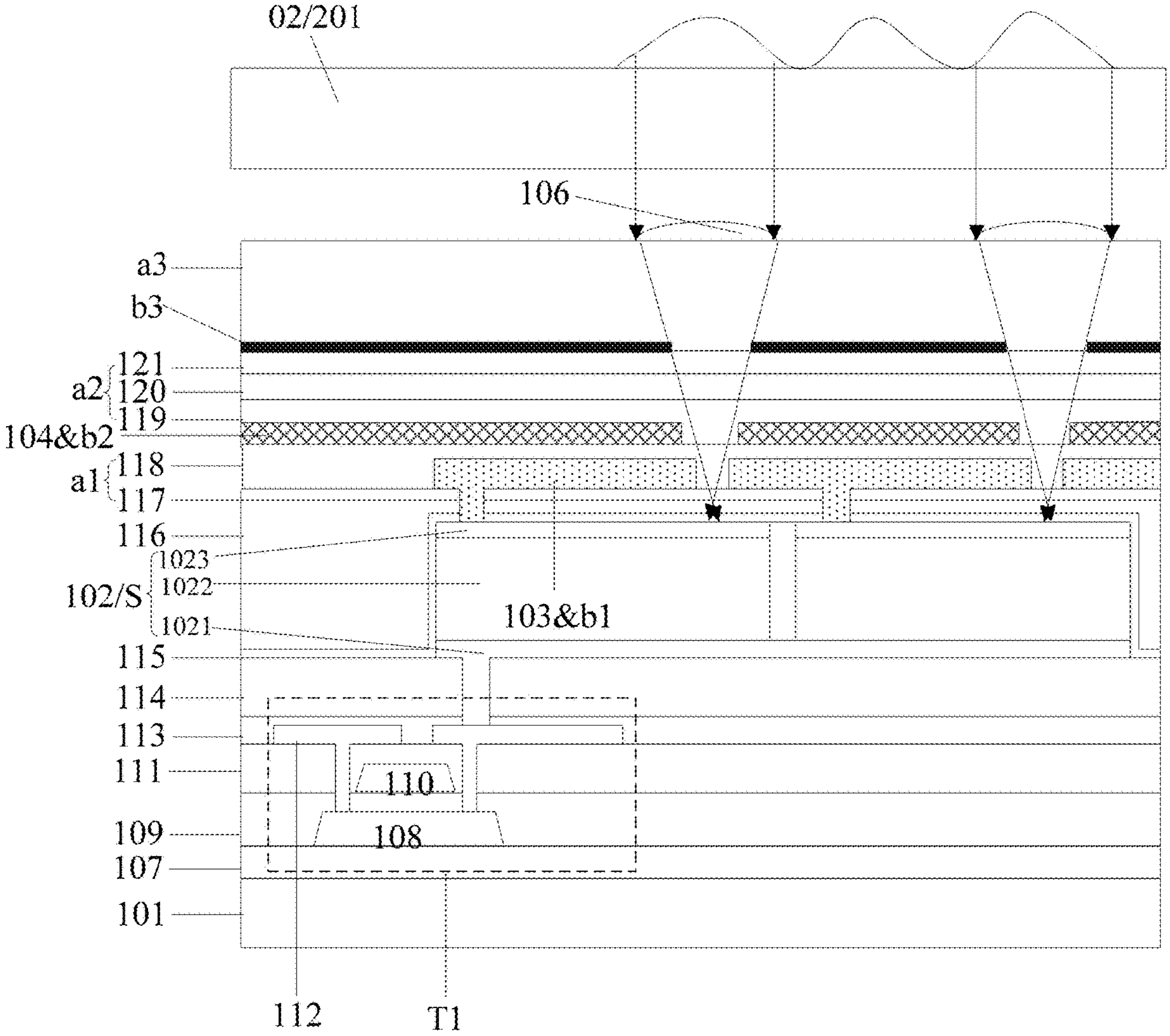
FIG. 11 is a schematic structural diagram of yet another cross-sectional view along line I'-II' of a display apparatus including the fingerprint recognition module shown in FIG. 8.

In some embodiments, as shown in FIGS. 2-4 and 9-11, the fingerprint recognition module according to the embodiment of the disclosure may further include a buffer layer (buffer) 107, an active layer (Poly) 108, a gate insulating layer (GI) 109, a gate metal layer (Gate) 110, an interlayer dielectric layer (ILD) 111, a source and drain metal layer (SD1) 112, a first insulation layer (PVX1) 113, a first planarization layer (PLN1) 114, a protection layer (Cover) 115, a resin layer (Resin) 116, a second insulation layer (PVX2) 117, a third insulation layer (PVX3) 118, a barrier layer (Barrier) 119, a shielding layer (ITO) 120, and a fourth insulation layer (OC) 121. In FIGS. 2 and 9, the third insulation layer 118, the barrier layer 119, the shielding layer 120 and the fourth insulation layer 121 serve as the first light transmitting layer a1. In FIGS. 3 and 10, the barrier layer 119, the shielding layer 120 and the fourth insulation layer 121 serve as the first light transmitting layer a1. In FIGS. 4 and 11, the third insulation layer 118 serves as the first light transmitting layer a1, and the barrier layer 119, the shielding layer 120 and the fourth insulation layer 121 serve as the second light transmitting layer a2.

When one photosensitive device 102 includes one photosensitive sub-device S and is arranged corresponding to one microlens 106, a zone where one photosensitive device 102 is located forms one pixel zone, a layout of which is designed as shown in FIGS. 23-38. In some embodiments, each pixel zone may further include a pixel driving circuit as shown in FIG. 39, where the pixel driving circuit includes a reset transistor (Reset TFT) T1, an amplifying transistor (AMP TFT) T2, and a read transistor (Read TFT) T3. A gate electrode of the reset transistor T1 is electrically connected with a first scanning signal line G1, a first electrode of the reset transistor T1 is electrically connected with a power line VDD, and a second electrode of the reset transistor T1 is electrically connected with the first electrode 1021. A gate electrode of the amplifying transistor T2 is electrically connected with the first electrode 1021, a first electrode of the amplifying transistor T2 is electrically connected with the power line VDD, and a second electrode of the amplifying transistor T2 is electrically connected with a first electrode of the read transistor T3. A gate electrode of the read transistor T3 is electrically connected with a second scanning signal line G2, and a second electrode of the read transistor T3 is electrically connected with a read line Test. A first electrode plate of a capacitor C is connected with the ground GND, and a second electrode plate of the capacitor C is electrically connected with the first electrode 1021.

Figure 23:
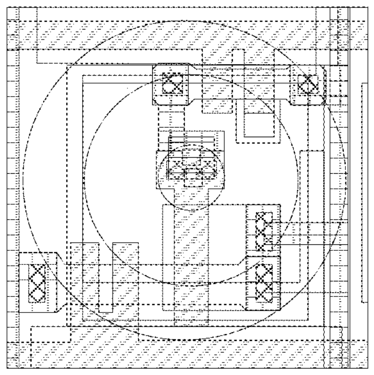
FIG. 23 is a schematic diagram of a stacked structure of a pixel zone in the fingerprint identification module shown in FIG. 1.

Specifically, FIG. 23 shows a stacked view of a pixel zone.

Figure 24:
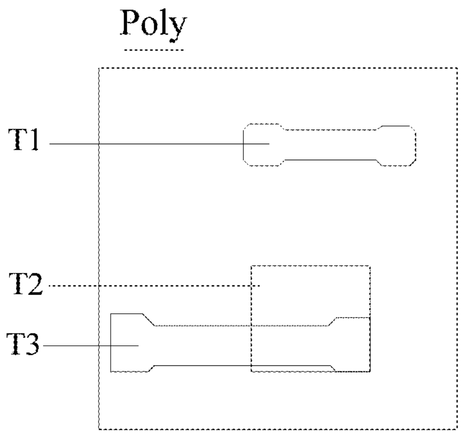
FIG. 24 is schematic structural diagram of an active layer in FIG. 23.

FIG. 24 shows a pattern of an active layer 108 in a pixel zone, which specifically includes active layers of the reset transistor T1, the amplifying transistor T2, and the read transistor T3.

Figure 25:
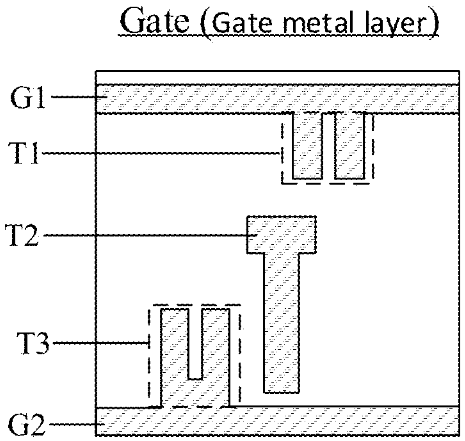
FIG. 25 is a schematic structural diagram of a gate metal layer in FIG. 23.

FIG. 25 shows a pattern of a gate metal layer 110 in a pixel zone, which specifically includes gate electrodes of the reset transistor T1, the amplifying transistor T2 and the read transistor T3, and the first scanning signal line G1 and the second scanning signal line G2. The reset transistor T1 and the read transistor T3 may each include two gate electrodes, that is, double-gate transistors, such that noise is reduced.

Figure 26:
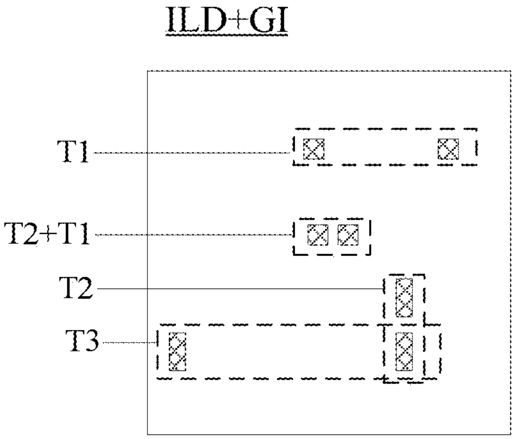
FIG. 26 is a schematic structural diagram of a gate insulating layer and an interlayer dielectric layer in FIG. 23.

FIG. 26 shows a pattern of a gate insulating layer 109 and an interlayer dielectric layer 111 in a pixel zone, which specifically includes a through hole allowing an active layer and source and drain electrodes of the reset transistor T1 to be connected, a through hole allowing an active layer and source and drain electrodes of the amplifying transistor T2 to be connected, a through hole allowing an active layer and source and drain electrodes of the read transistor T3 to be connected, and a through hole allowing a gate electrode of the amplifying transistor T2 and a source/drain electrode of the reset transistor T1 to be connected.

Figure 27:
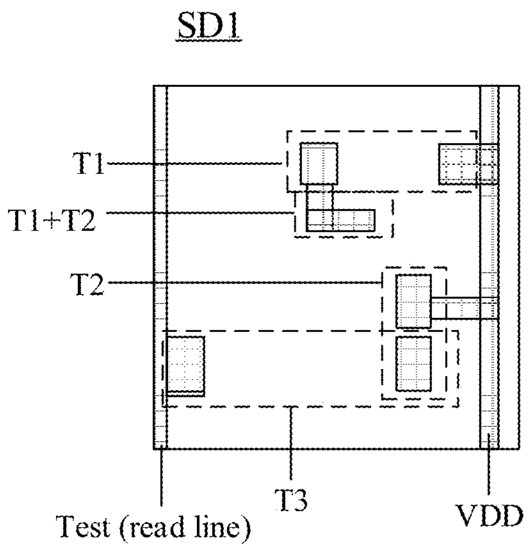
FIG. 27 is schematic structural diagram of a source and drain metal layer in FIG. 23.

FIG. 27 shows a pattern of a source and drain metal layer 112 in a pixel zone, which specifically includes source and drain electrodes of the reset transistor T1, the amplifying transistor T2 and the read transistor T3, the power line VDD and the read line Test. A source/drain electrode of the reset transistor T1 and a gate electrode of the amplifying transistor T2 have an overlapping area (T1+T2), such that the reset transistor is electrically connected with the amplifying transistor.

Figure 28:
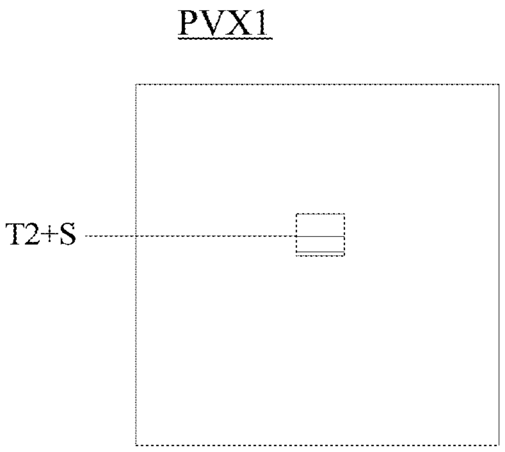
FIG. 28 is schematic structural diagram of a first insulation layer in FIG. 23.

FIG. 28 shows a pattern of a first insulation layer 113 in a pixel zone, which specifically includes a through hole allowing a gate electrode of the amplifying transistor T2 and the first electrode 1021 of the photosensitive sub-device S to be connected.

Figure 29:
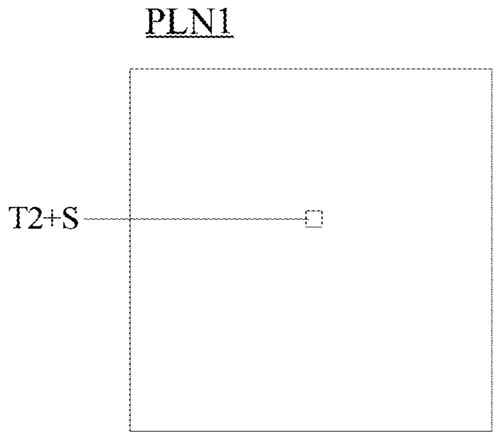
FIG. 29 is schematic structural diagram of a first planarization layer in FIG. 23.

FIG. 29 shows a pattern of a first planarization layer 114 in a pixel zone, which specifically includes a through hole allowing a gate electrode of the amplifying transistor T2 and the first electrode 1021 of the photosensitive sub-device S to be connected.

Figure 30:
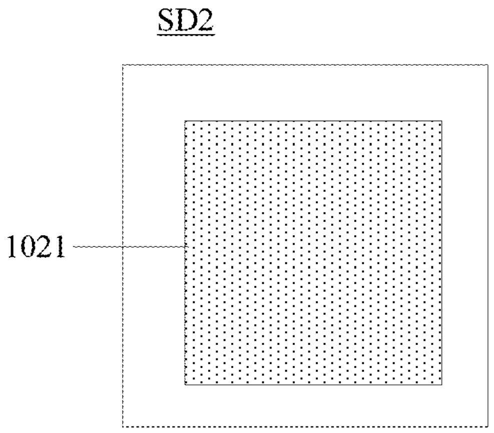
FIG. 30 is schematic structural diagram of a layer where a first electrode is located in FIG. 23.

FIG. 30 shows a pattern of a first electrode 1021 (also called SD2) in a pixel zone, which specifically includes a first electrode 1021 of a photosensitive sub-device S.

Figure 31:
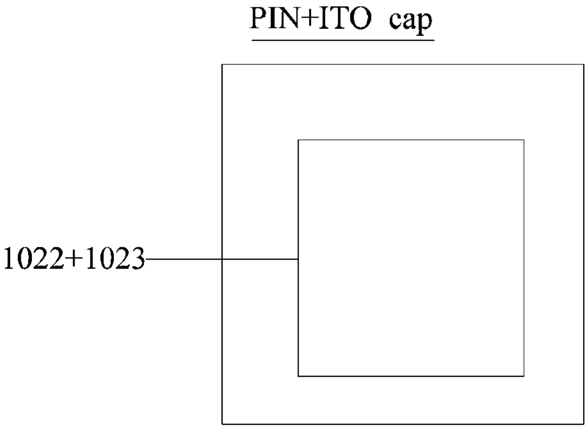
FIG. 31 is schematic structural diagram of a layer where a photoelectric conversion layer and a second electrode are located in FIG. 23.

FIG. 31 shows a pattern of a photoelectric conversion layer 1022 (also called PIN) and a second electrode 1023 (also called ITO cap) in a pixel zone, which specifically includes a photoelectric conversion layer 1022 and a second electrode 1023 of a photosensitive sub-device S.

Figure 32:
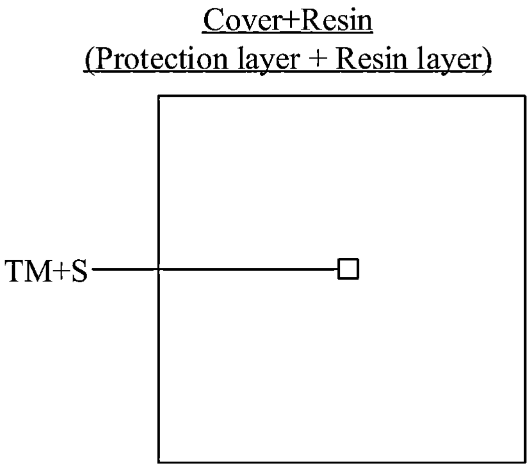
FIG. 32 is schematic structural diagram of a protection layer and a resin layer in FIG. 23.

FIG. 32 shows a pattern of a resin layer 116 and a protection layer 115 in a pixel zone, which specifically includes a through hole allowing a second electrode 1023 of a photosensitive sub-device S and the bias metal layer 103 (also called TM) to be connected.

Figure 33:
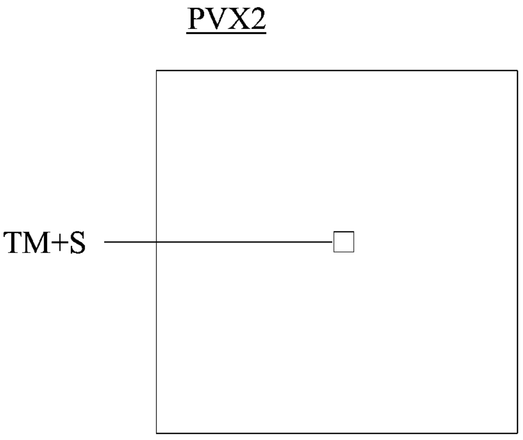
FIG. 33 is schematic structural diagram of a second insulation layer in FIG. 23.

FIG. 33 shows a pattern of a second insulation layer 117 in a pixel zone, which specifically includes a through hole allowing a second electrode 1023 of a photosensitive sub-device S and the bias metal layer 103 (also called TM) to be connected.

Figure 34:
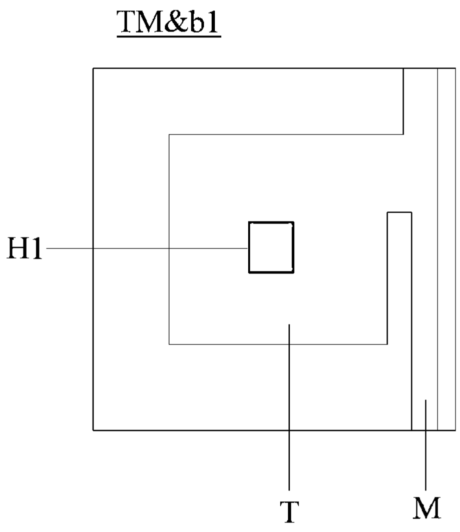
FIG. 34 is a schematic structural diagram of a bias metal layer in FIG. 23.

FIG. 34 shows a pattern of a bias metal layer 103 in a pixel zone, which specifically includes a main body part M extending in a column direction and a plurality of protruding parts T on the same side of the main body part. The protruding part T is electrically connected with a second electrode 1023 of a photosensitive sub-device S. FIG. 32 specifically shows that the bias metal layer 103 is reused as a first light shielding layer b1. Therefore, the protruding part T is provided with the first light transmitting hole H1.

Figure 35:
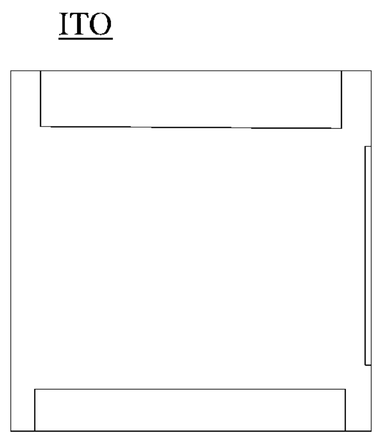
FIG. 35 is schematic structural diagram of a shielding layer in FIG. 23.

FIG. 35 shows a pattern of a shielding layer 120 in a pixel zone.

Figure 36:
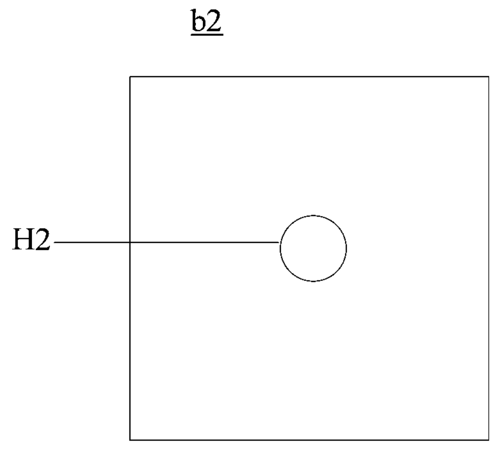
FIG. 36 is schematic structural diagram of a second light shielding layer in FIG. 23.

FIG. 36 shows a pattern of a second light shielding layer b2 in a pixel zone, which specifically includes a second light transmitting hole H2 overlapping with the first light transmitting hole H1.

Figure 37:
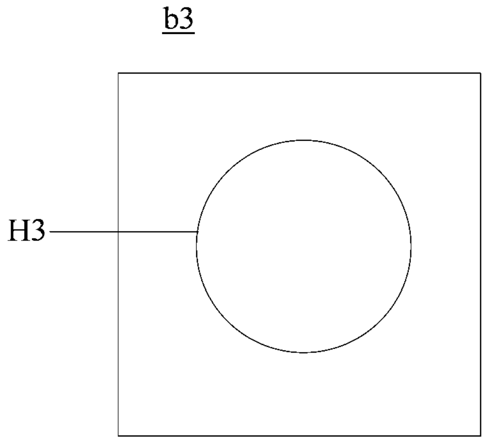
FIG. 37 is schematic structural diagram of a third light shielding layer in FIG. 23.

FIG. 37 shows a pattern of a third light shielding layer b3 in a pixel zone, which specifically includes a third light transmitting hole H3 overlapping with both the first light transmitting hole H1 and the second light transmitting hole H2.

Figure 38:
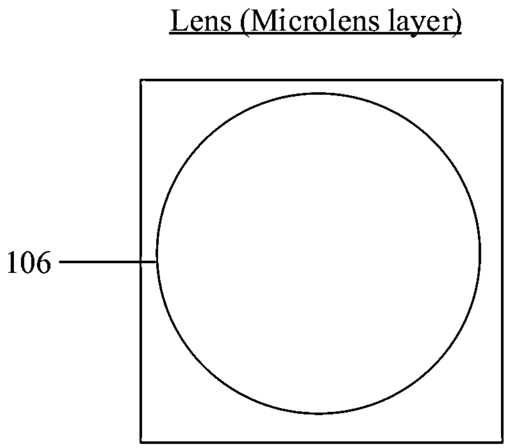
FIG. 38 is schematic structural diagram of a microlens layer in FIG. 23.
Figure 39:
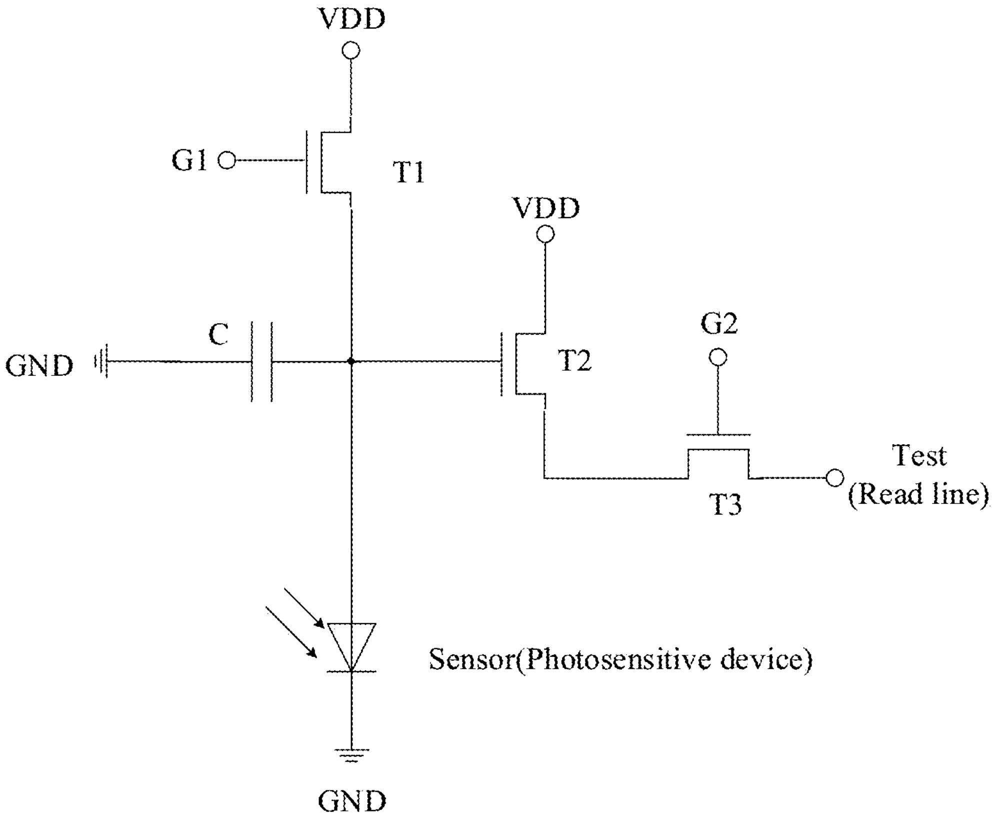
FIG. 39 is a schematic diagram of a pixel driving circuit in FIG. 23.
Figure 40:
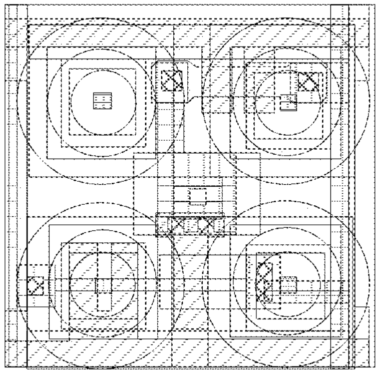
FIG. 40 is a schematic diagram of a stacked structure of a pixel zone in the fingerprint identification module shown in FIG. 8.
Figure 41:
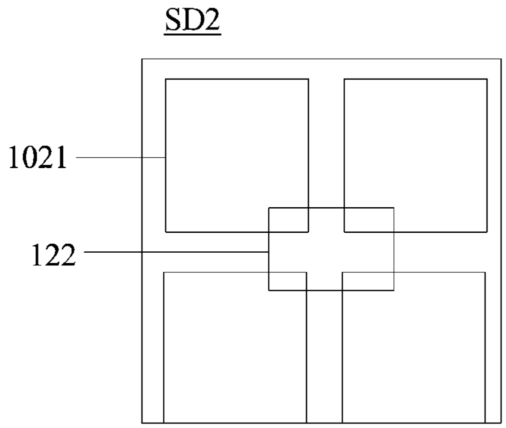
FIG. 41 is schematic structural diagram of a layer where a first electrode is located in FIG. 40.
Figure 42:
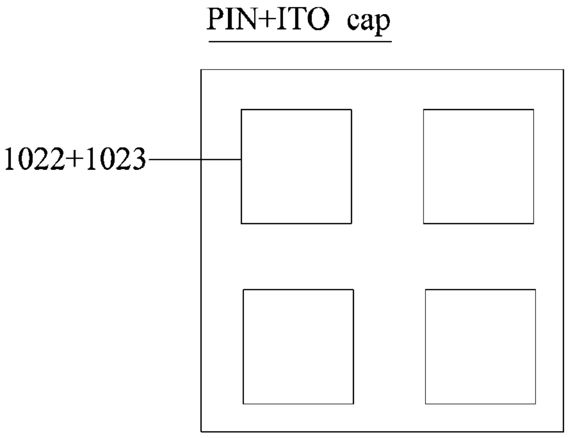
FIG. 42 is schematic structural diagram of a layer where a photoelectric conversion layer and a second electrode are located in FIG. 40.

FIG. 38 shows a pattern of a microlens layer lens in a pixel zone, which specifically includes a microlens 106 completely covering a photoelectric conversion layer 1022, a first light transmitting hole H1, a second light transmitting hole H2, and a third light transmitting hole H3.

When one photosensitive device 102 includes one photosensitive sub-device S and is arranged corresponding to one microlens 106 for example, a layout design of one pixel zone according to the disclosure is illustrated above. It should be understood that one photosensitive device 102 of the disclosure may further include a plurality of photosensitive sub-devices S and each of the photosensitive sub-devices S is arranged corresponding to one microlens 106 as shown in FIGS. 40-46. In order to facilitate illustration of the layout design of one pixel zone in this case, only a structure of a layer where the photosensitive device 102, a light guide film layer 105 and the microlens 106 are located will be described below, and reference may be made to the structure in which one photosensitive device 102 includes one photosensitive sub-device S and is arranged corresponding to one microlens 106 for the other film layer structures, which will not be repeated herein.

In some embodiments, as shown in FIGS. 9-11 and 40-46, each of the photosensitive devices 102 includes a plurality of photosensitive sub-devices S that are independent from each other. The fingerprint recognition module may further include a plurality of connection electrodes 122. The connection electrode 122 is arranged in the same layer as the first electrode 1021. The first electrodes 1021 of all the photosensitive sub-devices S are electrically connected with the pixel driving circuits (which are specifically the gate electrodes of the amplifying transistors T2) via the connection electrodes 122, and the second electrodes 1023 of all the photosensitive sub-devices S are each electrically connected with the bias metal layer 103 via the through holes running through the resin layer 116 and the second insulation layer 117, such that driving signals are loaded onto the photosensitive devices 102 via the pixel driving circuits and the bias metal layer 103.

Figure 43:
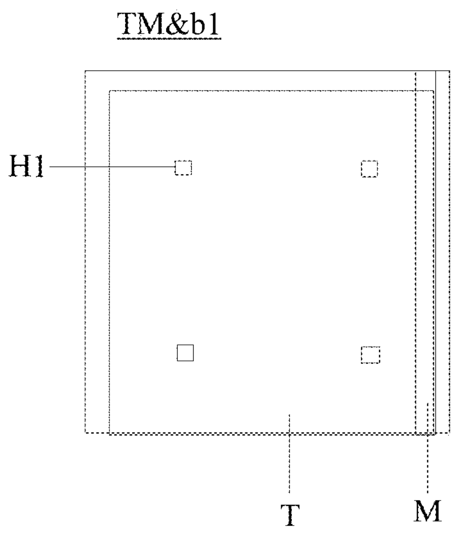
FIG. 43 is a schematic structural diagram of a bias metal layer in FIG. 40.
Figure 44:
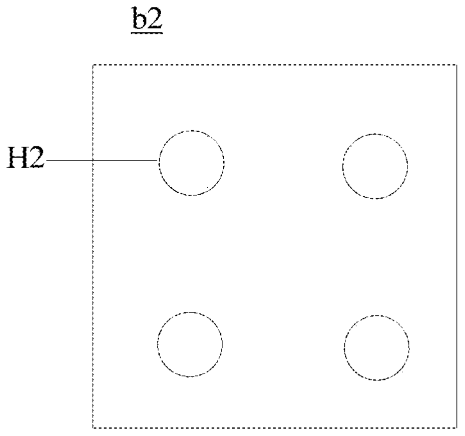
FIG. 44 is schematic structural diagram of a second light shielding layer in FIG. 40.
Figure 45:
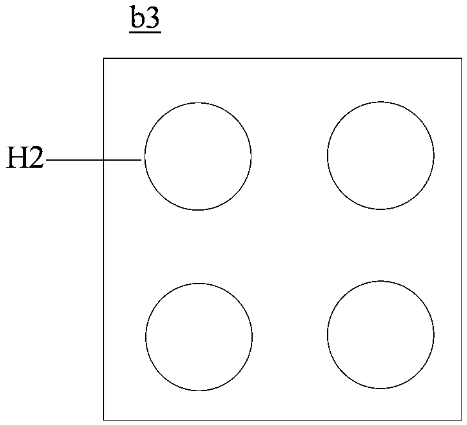
FIG. 45 is schematic structural diagram of a third light shielding layer in FIG. 40.
Figure 46:
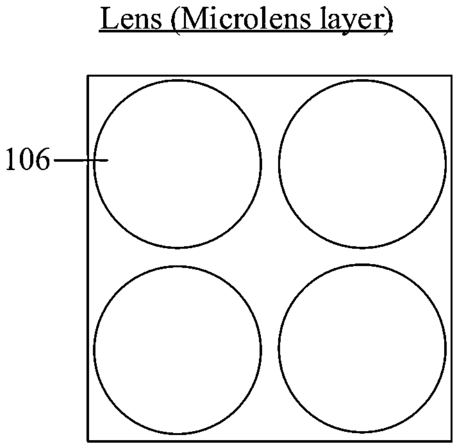
FIG. 46 is schematic structural diagram of a microlens layer in FIG. 40.

In some embodiments, in the fingerprint recognition module according to the embodiment of the disclosure, the bias metal layer 103 may include a plurality of bias lines as shown in FIGS. 34 and 43. Each of the bias lines is electrically connected with a column of photosensitive devices 102. Specifically, the bias line may include a main body part M extending in a column direction and a plurality of protruding parts T on the same side of the main body part M as mentioned above. The protruding parts T are electrically connected with the second electrodes 1022 in one of the photosensitive devices 102 respectively.

Generally, as shown in FIGS. 1 and 8, the fingerprint recognition module according to the embodiment of the disclosure may further include a gate driving chip (Gate IC) 123 and a source driving chip (Source IC) 123 that are located in a binding zone BD, and other essential components of the fingerprint recognition module should be understood by those of ordinary skill in the art, which will not be repeated herein.

Figure 47:
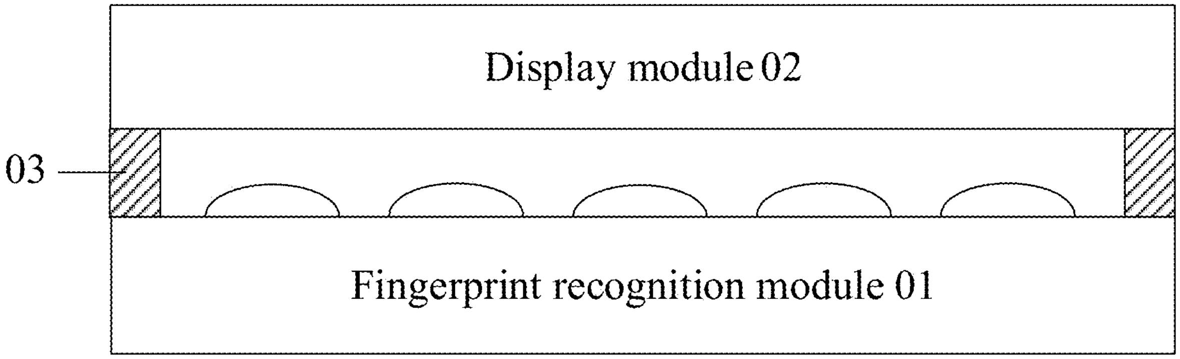
FIG. 47 is a schematic structural diagram of a display apparatus according to an embodiment of the disclosure.

Based on the same inventive concept, an embodiment of the disclosure provides a display apparatus. As shown in FIG. 47, the display apparatus includes the fingerprint recognition module 01 according to the embodiment of the disclosure and a display module 02 located above the fingerprint recognition module 01. The display module 02 is fixed to the fingerprint recognition module 01 via optically clear adhesive 03. A problem solving principle of the display apparatus is similar to a problem solving principle of the fingerprint recognition module, so reference may be made to implementation of the fingerprint recognition module according to the embodiment of the disclosure for implementation of the display apparatus according to the embodiment of the disclosure, which will not be repeated herein.

In some embodiments, in the display apparatus according to the embodiment of the disclosure, an orthogonal projection of the fingerprint recognition module 01 on a plane where the display apparatus is located and an orthogonal projection of the display module 02 on the plane where the display apparatus is located are approximately overlapped as shown in FIG. 47. The optically clear adhesive 03 is located in a frame zone of the display module 01. In this way, an air gap exists between the fingerprint recognition module 01 and the display module 02, such that a light path propagation direction of light reflected by a finger is kept unchanged advantageously, and in this case, full-screen fingerprint recognition can be achieved.

Figure 48:
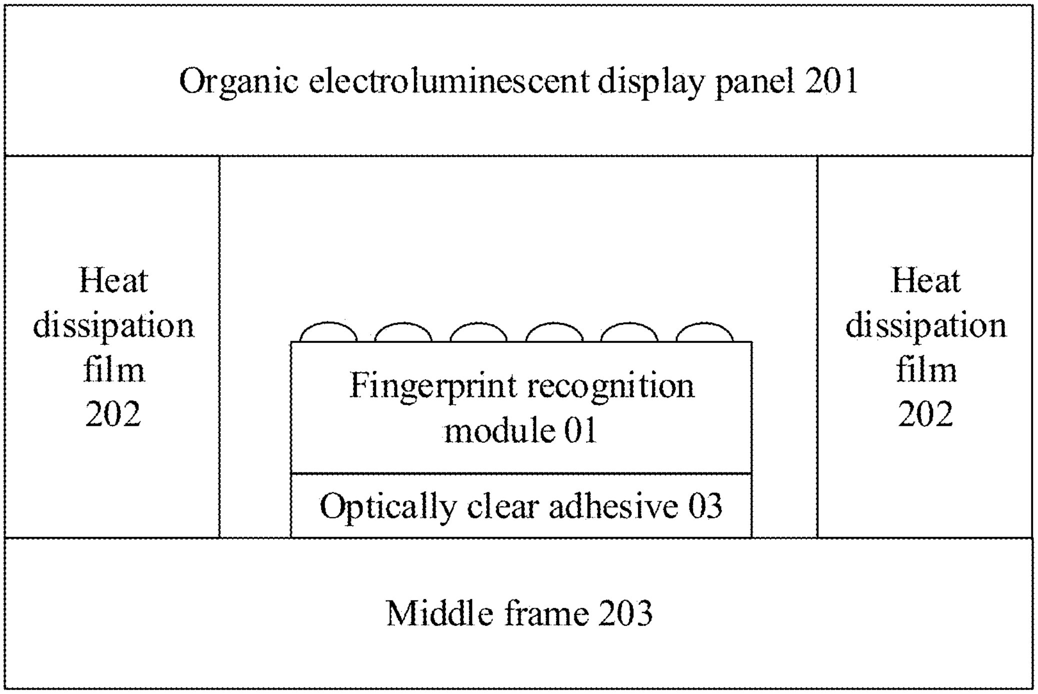
FIG. 48 is another schematic structural diagram of a display apparatus according to an embodiment of the disclosure.

In some embodiments, in the display apparatus according to the embodiment of the disclosure, the display module 02 may include an organic electroluminescent display panel 201, a heat dissipation film 202 arranged on a side of a display surface facing away from the organic electroluminescent display panel 201, and a middle frame 203 located on a side of the heat dissipation film 202 facing away from the organic electroluminescent display panel 201 as shown in FIG. 48. The heat dissipation film 202 includes a hollow structure. The fingerprint recognition module 01 is arranged in the hollow structure, and the fingerprint recognition module 01 is fixed to the middle frame 203 via the optically clear adhesive 03. In this way, local fingerprint recognition is achieved in a zone where the hollow structure is located.

In some embodiments, the heat dissipation film 202 may include graphite in contact with the organic electroluminescent display panel 201, foam in contact with the middle frame 203, and copper foil located between the graphite and the foam. The organic electroluminescent display panel 201 includes: a protection cover plate, optically clear adhesive, a polarizer, an encapsulation layer, a cathode, a luminescent functional layer, an anode and a driving back plate that are sequentially arranged from top to bottom.

During fingerprint recognition, when a finger touches the organic electroluminescent display panel 201, a light guide film layer 105 and a microlens 106 may filter approximately collimated light having a small angle, such that the light reaches a photoelectric conversion layer 1022 of the lower photosensitive device 102. The photoelectric conversion layer 1022 may detect an intensity of light reflected by a fingerprint. Downward diffuse reflection lights from a valley and a ridge have different energy, and a light intensity detected by an array of photosensitive devices 102 is different, such that fingerprint image information is obtained.

Apparently, those skilled in the art can make various modifications and variations to the embodiments of the disclosure without departing from the spirit and scope of the embodiments of the disclosure. In this way, if these modifications and variations of the embodiments of the disclosure fall within the scope of the claims of the disclosure and their equivalent technologies, the disclosure is also intended to include these modifications and variations.

What is claimed is:

1. A fingerprint recognition module, comprising:

a base substrate;

a photosensitive device layer above the base substrate, wherein the photosensitive device layer comprises a plurality of photosensitive devices;

a bias metal layer on a side of the photosensitive device layer facing away from the base substrate;

a noise reduction metal layer on a side of the bias metal layer facing away from the photosensitive device layer;

a light guide film layer comprising at least two light shielding layers arranged in a stacked manner, wherein each of the light shielding layers is provided with light transmitting holes arranged in an array, the light transmitting holes in all the light shielding layers are provided in a one-to-one correspondence manner, orthogonal projections of the light transmitting holes in the one-to-one correspondence manner on the base substrate are at least partially overlapped, orthogonal projections of the light transmitting holes correspondingly arranged on the base substrate are located within an orthogonal projection of a photosensitive device on the base substrate, and a light shielding layer close to the photosensitive device layer is disposed in a same layer as at least one of the bias metal layer and the noise reduction metal layer; and a microlens layer on a side of the light guide film layer facing away from the photosensitive device layer, wherein the microlens layer comprises a plurality of microlenses, and an orthogonal projection of the microlens on the base substrate covers and is larger than the orthogonal projections of the light transmitting holes on the base substrate;

wherein the light guide film layer comprises a first light shielding layer, a first light transmitting layer, a second light shielding layer, a second light transmitting layer, a third light shielding layer and a third light transmitting layer that are sequentially stacked on the photosensitive device layer, wherein the first light shielding layer comprises first light transmitting holes arranged in an array, the second light shielding layer comprises second light transmitting holes arranged in an array, and the third light shielding layer comprises third light transmitting holes arranged in an array;

wherein the light guide film layer and the microlenses satisfy following relational expressions:

$$L = h + h_1 + h_2 + h_3 + h_{x1} + h_{x2};$$

$$L = \left[W_3^2/(8h) + h/2\right] * K;$$

$$W_0 = L * \tan\theta;$$

$$(W_1 - W_0)/(2h_1) \leq (W_2 - W_1)/[2(h_2 + h_{x1})] \leq (W_3 - W_2)/[2(h_3 + h_{x2})],$$

wherein

L denotes a distance between a top surface of the microlens and the first light shielding layer;

θ denotes a light receiving angle;

K denotes a specific coefficient related to the microlens;

$W_0$ denotes a diameter of the first light transmitting hole;

$W_1$ denotes a diameter of the second light transmitting hole;

$W_2$ denotes a diameter of the third light transmitting hole;

$W_3$ denotes an aperture of the microlens;

$h_1$ denotes a thickness of the first light transmitting layer;

$h_2$ denotes a thickness of the second light transmitting layer;

$h_3$ denotes a thickness of the third light transmitting layer;

$h_{x1}$ denotes a thickness of the second light shielding layer; and $h_{x2}$ denotes a thickness of the third light shielding layer.

2. The fingerprint recognition module according to claim 1, wherein diameters of the light transmitting holes correspondingly arranged in all the light shielding layers increase sequentially in a direction of ascending distance from the photosensitive device layer.

3. The fingerprint recognition module according to claim 2, wherein orthogonal projections of centers of the light transmitting holes correspondingly arranged in all the light shielding layers on the base substrate are overlapped.

4. The fingerprint recognition module according to claim 1, wherein the first light shielding layer is reused as the bias metal layer.

5. The fingerprint recognition module according to claim 1, wherein the first light shielding layer and the noise reduction metal layer are disposed in a same layer and made of a same material.

6. The fingerprint recognition module according to claim 1, wherein the first light shielding layer is reused as the bias metal layer, and the second light shielding layer and the noise reduction metal layer are disposed in a same layer and made of a same material.

7. The fingerprint recognition module according to claim 1, wherein $1° \leq \theta \leq 10°$;

2 μm $\leq W_0 \leq$ 10 μm;

4 μm $\leq W_1 \leq$ 15 μm;

6 μm $\leq W_2 \leq$ 18 μm;

10 μm $\leq W_3 \leq$ 30 μm;

1 μm $\leq h_1 \leq$ 10 μm;

1 μm $\leq h_2 \leq$ 5 μm;

1 μm $\leq h_3 \leq$ 10 μm;

1 μm $\leq h_{x1} \leq$ 2 μm; and

1 μm $\leq h_{x2} \leq$ 2 μm.

8. The fingerprint recognition module according to claim 1, wherein each of the photosensitive devices comprises at least one independent photosensitive sub-device, and the photosensitive sub-device comprises a first electrode, a photoelectric conversion layer and a second electrode that are stacked; and the photosensitive sub-device and the microlens are arranged in a one-to-one correspondence manner, and an orthogonal projection of the photoelectric conversion layer on the base substrate is located within an orthogonal projection of the microlens on the base substrate.

9. The fingerprint recognition module according to claim 8, further comprising a plurality of pixel driving circuits and a plurality of connection electrodes, and the plurality of pixel driving circuits and the plurality of connection electrodes being located between the photosensitive device layer and the base substrate, wherein each of the photosensitive devices comprises a plurality of photosensitive sub-devices that are independent from each other, and the first electrode is disposed in a same layer as the connection electrode; and first electrodes of all the photosensitive sub-devices are electrically connected with the pixel driving circuits via the connection electrodes, and second electrodes of all the photosensitive sub-devices are each electrically connected with the bias metal layer.

10. The fingerprint recognition module according to claim 9, wherein the bias metal layer comprises a plurality of bias lines, each of the bias lines comprises a main body part extending in a column direction and a plurality of protruding parts on a same side of the main body part, and the protruding parts are electrically connected with second electrodes in one of the photosensitive devices respectively.

11. The fingerprint recognition module according to claim 9, wherein the pixel driving circuit comprises: a reset transistor, an amplifying transistor, and a read transistor;

wherein the reset transistor and the read transistor are double-gate transistors.

12. The fingerprint recognition module according to claim 1, wherein a distance between a surface of a side of the base substrate facing the photosensitive device layer and an apex of the microlens is greater than or equal to 30 μm and less than or equal to 50 μm.

13. A display apparatus, comprising a fingerprint recognition module and a display module above the fingerprint recognition module, wherein the display module is fixed to the fingerprint recognition module via optically clear adhesive;

wherein fingerprint recognition module comprises:

a base substrate;

a photosensitive device layer above the base substrate, wherein the photosensitive device layer comprises a plurality of photosensitive devices;

a bias metal layer on a side of the photosensitive device layer facing away from the base substrate;

a noise reduction metal layer on a side of the bias metal layer facing away from the photosensitive device layer;

a light guide film layer comprising at least two light shielding layers arranged in a stacked manner, wherein each of the light shielding layers is provided with light transmitting holes arranged in an array, the light transmitting holes in all the light shielding layers are provided in a one-to-one correspondence manner, orthogonal projections of the light transmitting holes in the one-to-one correspondence manner on the base substrate are at least partially overlapped, orthogonal projections of the light transmitting holes correspondingly arranged on the base substrate are located within an orthogonal projection of a photosensitive device on the base substrate, and a light shielding layer close to the photosensitive device layer is disposed in a same layer as at least one of the bias metal layer and the noise reduction metal layer; and a microlens layer on a side of the light guide film layer facing away from the photosensitive device layer, wherein the microlens layer comprises a plurality of microlenses, and an orthogonal projection of the microlens on the base substrate covers and is larger than the orthogonal projections of the light transmitting holes on the base substrate;

wherein the light guide film layer comprises a first light shielding layer, a first light transmitting layer, a second light shielding layer, a second light transmitting layer, a third light shielding layer and a third light transmitting layer that are sequentially stacked on the photosensitive device layer, wherein the first light shielding layer comprises first light transmitting holes arranged in an array, the second light shielding layer comprises second light transmitting holes arranged in an array, and the third light shielding layer comprises third light transmitting holes arranged in an array;

wherein the light guide film layer and the microlenses satisfy following relational expressions:

$$L = h + h_1 + h_2 + h_3 + h_{x1} + h_{x2};$$

$$L = \left[W_3^2/(8h) + h/2\right] * K;$$

$$W_0 = L * \tan\theta;$$

$$(W_1 - W_0)/(2h_1) \leq (W_2 - W_1)/[2(h_2 + h_{x1})] \leq (W_3 - W_2)/[2(h_3 + h_{x2})],$$

wherein

L denotes a distance between a top surface of the microlens and the first light shielding layer;

θ denotes a light receiving angle;

K denotes a specific coefficient related to the microlens;

$W_0$ denotes a diameter of the first light transmitting hole;

$W_1$ denotes a diameter of the second light transmitting hole;

$W_2$ denotes a diameter of the third light transmitting hole;

$W_3$ denotes an aperture of the microlens;

$h_1$ denotes a thickness of the first light transmitting layer;

$h_2$ denotes a thickness of the second light transmitting layer;

$h_3$ denotes a thickness of the third light transmitting layer;

$h_{x1}$ denotes a thickness of the second light shielding layer; and $h_{x2}$ denotes a thickness of the third light shielding layer.

14. The display apparatus according to claim 13, wherein an orthogonal projection of the fingerprint recognition module on a plane where the display apparatus is located and an orthogonal projection of the display module on the plane where the display apparatus is located are approximately overlapped, and the optically clear adhesive is located in a frame zone of the display module.

15. The display apparatus according to claim 13, wherein the display module comprises:

an organic electroluminescent display panel;

a heat dissipation film on a side of a display surface facing away from the organic electroluminescent display panel; and a middle frame on a side of the heat dissipation film facing away from the organic electroluminescent display panel;

wherein the heat dissipation film comprises a hollow structure, the fingerprint recognition module is arranged in the hollow structure, and the fingerprint recognition module is fixed to the middle frame via the optically clear adhesive.

* * * * *